US007985535B2

(12) United States Patent
Taguchi et al.

(10) Patent No.: US 7,985,535 B2
(45) Date of Patent: Jul. 26, 2011

(54) IMAGE-FORMING METHOD AND LITHOGRAPHIC PRINTING PLATE PRECURSOR

(75) Inventors: Yoshinori Taguchi, Haibara-gun (JP); Tetsunori Matsushita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 187 days.

(21) Appl. No.: 12/239,038

(22) Filed: Sep. 26, 2008

(65) Prior Publication Data

US 2009/0087781 A1      Apr. 2, 2009

(30) Foreign Application Priority Data

Sep. 28, 2007  (JP) ................................. 2007-256781

(51) Int. Cl.
*G03F 7/32* (2006.01)
*G03F 7/027* (2006.01)
*G03F 7/033* (2006.01)
(52) U.S. Cl. .................... 430/325; 430/302; 430/281.1; 430/944; 430/905; 430/910
(58) Field of Classification Search ................... None
See application file for complete search history.

(56) References Cited

U.S. PATENT DOCUMENTS 3,905,815 A * 9/1975 Bonham ....................... 430/156
4,427,760 A    1/1984 Nagazawa et al.

2003/0138732 A1   7/2003  Nagase
2004/0013968 A1   1/2004  Teng

FOREIGN PATENT DOCUMENTS

| EP | 1260867 A1 | 11/2002 |
|----|------------|---------|
| EP | 1288722 A2 | 3/2003 |
| JP | 2002-365789 A | 12/2002 |
| JP | 2003-066624 A | 3/2003 |
| JP | 2003-287880 A | 10/2003 |
| JP | 2004-109427 A | 4/2004 |

OTHER PUBLICATIONS

Guo, "Nanoimprint Lithography: Methods and Material Requirements", Advanced Materials, 2007, vol. 19, pp. 495-513.*
English translation of JP, 2003-287880, A (2003) from machine translation from AIPN Japan Patent Office National Center for Industrial Property Information and Training, generated Sep. 12, 2010, 32 pages.*

\* cited by examiner

*Primary Examiner* — Cynthia Hamilton
(74) *Attorney, Agent, or Firm* — Sughrue Mion, PLLC

(57) ABSTRACT

An image-forming method includes: exposing a negative type image-forming material including a support and an image-recording layer containing a binder polymer containing at least one group capable of being converted to a sulfonate upon a reaction with an aqueous solution containing at least one of a sulfite and a bisulfite, a sensitizing dye, a polymerization initiator, and a compound having an ethylenically unsubstituted bond; and removing an unexposed area of the image-recording layer with an aqueous solution containing at least one of a sulfite and a bisulfite.

6 Claims, 1 Drawing Sheet

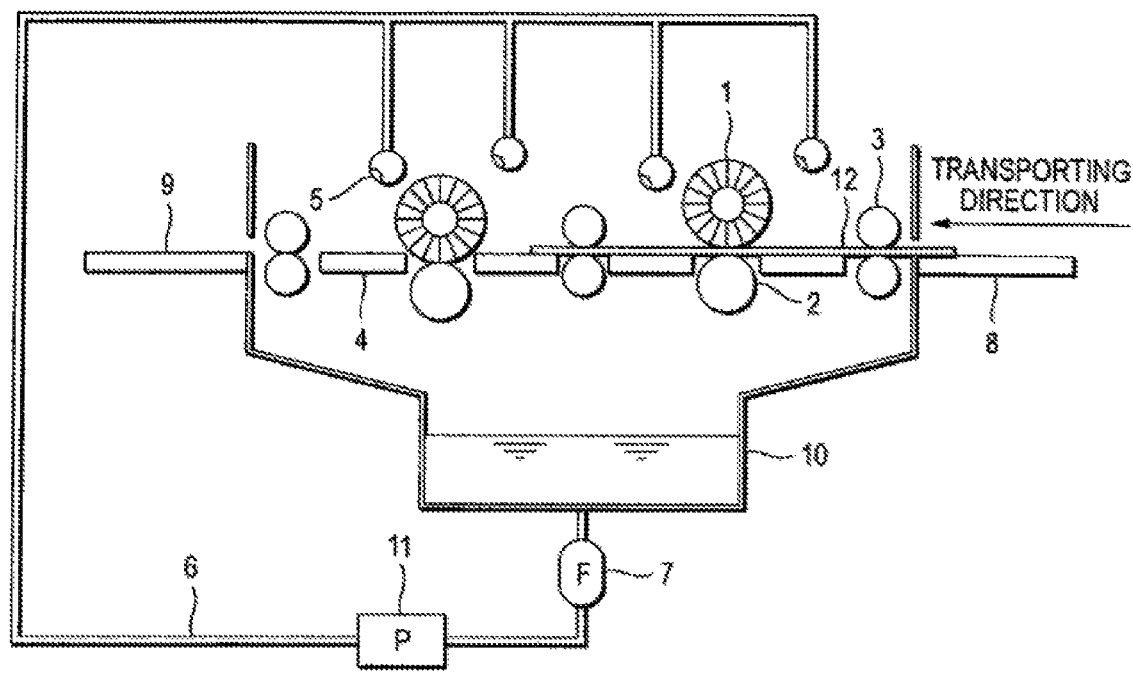

IMAGE-FORMING METHOD AND LITHOGRAPHIC PRINTING PLATE PRECURSOR

FIELD OF THE INVENTION

The present invention relates to an image-forming method and a lithographic printing plate precursor.

BACKGROUND OF THE INVENTION

In general, a lithographic printing plate has a surface composed of an oleophilic image area and a hydrophilic non-image area. Lithographic printing is a printing method comprising supplying alternately dampening water and oily ink on the surface of lithographic printing plate, making the hydrophilic non-image area a dampening water-receptive area (ink unreceptive area) and depositing the oily ink only to the oleophilic image area by utilizing the nature of the dampening water and oily ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive layer (image-recording layer) has heretofore been broadly used. Ordinarily, a lithographic printing plate is obtained by conducting plate-making by a method of exposing the lithographic printing plate precursor through an original, for example, a lith film, and then treating the exposed lithographic printing plate precursor to remove the photosensitive layer in the unnecessary non-image area by dissolving with a an alkaline developer or an organic solvent thereby revealing a surface of the hydrophilic support to form the non-image area while leaving the photosensitive layer in the image area.

In the hitherto known plate-making process of lithographic printing plate precursor, after the exposure, the step of removing the unnecessary photosensitive layer by dissolving, for example, with a developer is required. However, it is one of the subjects to simplify such an additional wet treatment as described above. As one means for the simplification, it has been desired to conduct the development with a nearly neutral aqueous solution or simply with water.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate technique of carrying the digitalized image information on highly converging radiation, for example, laser light and conducting scanning exposure of a lithographic printing plate precursor with the light thereby directly preparing a lithographic printing plate without using a lith film. Thus, it is one of the important technical subjects to obtain a lithographic printing plate precursor adaptable to the technique described above.

Based on the background described above, adaptation of plate-making operation to both simplification and digitalization has been demanded strongly more and more than ever before.

In response to such a demand, for instance, it is described in JP-A 2002-365789 (the term "JP-A" as used herein means an "unexamined published Japanese patent application") that by incorporating a compound having an ethylene oxide chain into an image-forming layer of a lithographic printing plate precursor comprising a hydrophilic support and the image-forming layer containing a hydrophobic precursor, a hydrophilic resin and a light to heat converting agent, the lithographic printing plate precursor enables printing after conducting exposure and wet development processing using as a developer, water or an appropriate aqueous solution, besides on-machine development.

Also, a processing method of lithographic printing plate precursor is described in US2004/0013968A1 which comprises preparing a lithographic printing plate precursor comprising (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developer containing 60% by weight or more of water and having pH of 2.0 to 10.0, exposing imagewise the lithographic printing plate precursor with an infrared laser, and removing the unhardened region of the heat-sensitive layer with the aqueous developer.

On the other hand, methods of preparing a lithographic printing plate using a developer containing a sulfite are described in JP-A-2003-66624 (corresponding to US2003/0138732A1), JP-A-2003-287880 and JP-A-2004-109427. However, all these methods use an alkali developer having pH of 10 or more and there is no description as to combination capable of undergoing development with an aqueous developer having pH of 2.0 to 10.0. In addition, improvement in the developing property utilizing a reaction between a sulfite and a polymer is not suggested.

SUMMARY OF THE INVENTION

The condition required for the photosensitive layer in order to sustain a developing property in an aqueous developer having pH of 2.0 to 10.0 is that the non-image area, that is, the region into which the developer should penetrate is required to have high hydrophilicity or high water-permeability and on the contrary, the image area, that is, the region into which the developer should not penetrate is required to have high hydrophobicity or low water-permeability. In order to solve the problem, techniques of increasing discrimination of water resistance between the unexposed area and the exposed area by using a highly sensitive reaction system, that is, the reaction system of high curing efficiency and of preventing the occurrence of fog by handling under safelight have heretofore been employed. However, satisfactory improvement in the discrimination of water resistance between the unexposed area and the exposed area can not be obtained according to such techniques. In order to solve the problem, a technique of sustaining hydrophobicity in the image area, that is, the region into which a developer should not penetrate and of causing polarity change from hydrophobicity to hydrophilicity due to the penetration of developer in the non-image area, that is, the region into which the developer should penetrate, specifically, a polarity change technique has been requested. The present invention responds to the problem. An object of the invention is to provide an image-forming method comprising developing a lithographic printing plate precursor having high sensitivity and high printing durability and excellent in stain resistance with an aqueous developer having pH of 2.0 to 10.0 and a lithographic printing plate precursor for use in the method.

The present invention includes the following constructions.

(1) An image-forming method comprising exposing a negative type image-forming material comprising a support and an image-recording layer containing (A) to (D) described below, and removing an unexposed area of the image-recording layer with an aqueous solution containing a sulfite and/or a bisulfite:
(A) a binder polymer containing at least one group capable of being converted to a sulfonate upon a reaction with the aqueous solution containing a sulfite and/or a bisulfite,
(B) a sensitizing dye,
(C) a polymerization initiator, and
(D) a compound containing an ethylenically unsubstituted bond.
(2) The image-forming method as described in (1) above, wherein the aqueous solution has pH of 2 to 10.
(3) The image-forming method as described in (1) or (2) above, wherein the group capable of being converted to a sulfonate upon a reaction with the aqueous solution containing a sulfite and/or a bisulfite contained in the binder polymer (A) is a group selected from the group consisting of a halogen atom, an unsaturated double bond group, an unsaturated triple bond group, an aldehyde group, a ketone group and a combination thereof.
(4) A lithographic printing plate precursor comprising a support and an image-recording layer containing (A) to (D) described below:
(A) a binder polymer containing at least one group capable of being converted to a sulfonate upon a reaction with the aqueous solution containing a sulfite and/or a bisulfite,
(B) a sensitizing dye,
(C) a polymerization initiator, and
(D) a compound containing an ethylenically unsubstituted bond.
(5) The lithographic printing plate precursor as described in (4) above, wherein the group capable of being converted to a sulfonate upon a reaction with the aqueous solution containing a sulfite and/or a bisulfite contained in the binder polymer (A) is a group selected from the group consisting of a halogen atom, an unsaturated double bond group, an unsaturated triple bond group, an aldehyde group, a ketone group and a combination thereof.
(6) The lithographic printing plate precursor as described in (4) or (5) above, wherein the group capable of being converted to a sulfonate upon a reaction with the aqueous solution containing a sulfite and/or a bisulfite contained in the binder polymer (A) is present at a terminal of a side chain of the binder polymer.
(7) The lithographic printing plate precursor as described in any one of (4) or (6) above, wherein the sensitizing dye (B) has a maximum absorption wavelength in a range of 360 to 450 nm.

Although the function mechanism according to the invention is not quite clear, it is presumed as follows. Heretofore, developing property in a developer having pH of 2.0 to 10.0 is imparted to a photosensitive layer by increasing hydrophilicity of a binder polymer. However, the increase in hydrophilicity of a binder polymer unavoidably causes sever penetration of the developer or dampening water into the exposed area which becomes a big factor in deterioration of the printing durability.

By using the aqueous solution containing a sulfite and/or a bisulfite, and further using in the image-forming layer (hereinafter, also referred to as "photosensitive layer") the binder polymer containing a group capable of being converted to a sulfonate upon a reaction with the aqueous solution (hereinafter, also referred to as "developer") in accordance with the invention, in the non-image area the group contained in the binder polymer is converted to a sulfonate group with the penetration of the developer to greatly increase the hydrophilicity. In the image area, on the other hand, since the developer does not penetrate and the conversion described above does not occur, the hydrophobicity is sustained in the image area of the photosensitive layer.

It is believed that according to the function mechanism, the discrimination between developer permeability and water (dampening water) permeability is improved, resulting in improvements not only in the developing property but also the printing durability. It is also believed that since the group contained in the binder polymer is converted to a sulfonate group at the development, the adhesion property of the image-forming layer to a support and/or a subbing layer which is optionally provided decreases so that the stain resistance can also be improved.

According to the present invention, by using the aqueous solution containing a sulfite and/or a bisulfite, and further using in the image-forming layer the binder polymer containing a group capable of being converted to a sulfonate upon a reaction with the aqueous solution, a lithographic printing plate precursor capable of being developed with a developer having pH of 2.0 to 10.0 and having high sensitivity and an image-forming method providing a lithographic printing plate having high printing durability and excellent stain resistance can be provided.

BRIEF DESCRIPTION OF THE DRAWINGS

The Drawing shows a structure of an automatic development processor.

| [Description of reference numerals and signs] | |
|---|---|
| 1: | Rotating brush roller |
| 2: | Backing roller |
| 3: | Transport roller |
| 4: | Transport guide plate |
| 5: | Spray pipe |
| 6: | Pipe line |
| 7: | Filter |
| 8: | Plate supply table |
| 9: | Plate discharge table |
| 10: | Developer tank |
| 11: | Circulating pump |
| 12: | Plate |

DETAILED DESCRIPTION OF THE INVENTION

The image-forming method and lithographic printing plate precursor according to the invention will be described in more detail below. First, the aqueous solution (developer) for use in the image-forming method according to the invention will be described.
(Developer)
<Sulfite and/or Bisulfite Used in Invention>
The developer for use in the invention is an aqueous solution containing a sulfite and/or a bisulfite and preferably having pH of 2.0 to 10.0. More preferably, the developer for use in the invention is an aqueous solution having pH of 2.0 to 6.5. For instance, the developer is preferably a solution containing only water as a solvent or an aqueous solution containing water as a main component (containing 60% by weight or more of water). Particularly, an aqueous solution having the same composition as conventionally known dampening water, an aqueous solution containing a surfactant (for example, an anionic surfactant, a nonionic surfactant, a cationic surfactant, an amphoteric surfactant or a fluorine-based surfactant) or an aqueous solution containing a water-soluble polymer compound is preferable. An aqueous solution containing both a surfactant and a water-soluble polymer compound is especially preferable. The pH of the developer is more preferably from 2.0 to 6.0, still more preferably from 2.0 to 5.0. In the case of using an acidic to neutral developer, the developer preferably contains either an organic acid or an inorganic acid. By incorporating the organic acid or inorganic acid into the developer, the developing property can be improved at the plate making and the occurrence of stain in the non-image area of a printing plate obtained by the plate making can be prevented.

The sulfite used in the developer according to the invention may be any salt of organic salt and inorganic salt. The term "bisulfite" means a hydrogen sulfite and the bisulfite used in the developer according to the invention may be any salt of organic salt and inorganic salt. Specific examples of the sulfite and bisulfite preferably include sodium sulfite, potassium sulfite, ammonium sulfite, sodium hydrogen sulfite, potassium hydrogen sulfite and ammonium hydrogen sulfite. The content of the sulfite and/or bisulfite in the developer for use in the invention is preferably from 0.1 to 20% by weight, more preferably from 0.5 to 10% by weight. When the content of the sulfite and/or bisulfite is too small, the polarity conversion performance, that is, the developing property may decrease and on the contrary, when it is too large, the printing durability of printing plate obtained may be degraded and stability of the developer may be adversely affected.

<Surfactant>

In the invention, it is preferred to use a surfactant in the developer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols and copolymers of polyethylene glycol and polypropylene glycol.

Further, from the standpoint of stable solubility in water or opacity, with respect to the nonionic surfactant used in the developer according to the invention, the HLB (hydrophile-lipophile balance) value thereof is preferably 6 or more, more preferably 8 or more. Moreover, the amount of the nonionic surfactant contained in the developer is preferably from 0.01 to 10% by weight, more preferably from 0.01 to 5% by weight.

Furthermore, a surfactant, for example, an oxyethylene adduct of acetylene glycol type or acetylene alcohol type, a fluorine-based surfactant or a silicon-based surfactant can also be used.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, as the fluorine-based surfactant containing a perfluoroalkyl group in its molecule, for instance, an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group are exemplified. Further, fluorine-based surfactants described in JP-A-62-170950, JP-A-62-226143 and JP-A-60-168144 are also preferably exemplified.

As the surfactant for use in the developer according to the invention, an amphoteric surfactant and/or anionic surfactant are preferable. Specifically, a carboxybetaine, for example, n-octyl dimethyl betaine, N-lauryl dimethyl betaine (Pionin C157K, produced by Takemoto Oil & Fat Co., Ltd.) or polyoxyethylene laurylamino ether (Pionin D3110, produced by Takemoto Oil & Fat Co., Ltd.), and a sulfonic acid or sulfuric acid anionic surfactant, for example, sodium dioctylsulfosuccinate, polyoxyethylene naphthyl ether sulfate ester salt (Newcol B4SN, produced by Nippon Nyukazai Co., Ltd.), sodium alkylnaphthalenesulfonate (Pelex NB-L, produced by Kao Corp.) or sodium dodecybenzenesulfonate are exemplified.

The amount of the surfactant contained in the developer is preferably from 0.01 to 10% by weight, more preferably from 0.01 to 5% by weight.

<Water-Soluble Polymer Compound>

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pullulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range of 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, more preferably from 0.5 to 10% by weight, in the developer.

<Organic Solvent>

The developer according to the invention may contain an organic solvent. The organic solvent that can be contained in the developer includes, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

<Chelating Agent>

The developer may contain a chelating agent. Examples of the chelating agent include a polyphosphate, for example, $Na_2P_2O_7$, $Na_5P_3O_3$, $Na_3P_3O_9$, $Na_2O_4P(NaO_3P)PO_3Na_2$, Calgon (sodium polymethaphosphate); an aminopolycarboxylic acid, for example, ethylenediaminetetraacetic acid, potassium salt thereof, sodium salt thereof, triethylenetetraminehexaacetic acid, potassium salt thereof, sodium salt thereof, hydroxyethylethylenediaminetriacetic acid, potassium salt thereof, sodium salt thereof, nitrilotriacetic acid, potassium salt thereof, sodium salt thereof, 1,2-diaminocyclohexanetetraacetic acid, potassium salt thereof, sodium salt thereof, or 1,3-diamino-2-propanoltetraacetic acid, potassium salt thereof, sodium salt thereof; and an organic phosphonic acid, for example, 2-phosphonobutanetricarboxylic acid-1,2,4, potassium salt thereof, sodium salt thereof, 2-phosphonobutanonetricarboxylic acid-2,3,4, potassium salt thereof, sodium salt thereof, 1-phosphonoethanetricarboxylic acid-1,2,2, potassium salt thereof, sodium salt thereof, 1-hydroxyethane-1,1-diphosphonic acid, potassium salt thereof, sodium salt thereof, or aminotri(methylenephosphonic acid), potassium salt thereof, sodium salt thereof. Although the optimum amount of the chelating agent varies corresponding to the hardness and amount of hard water used, in general, the amount thereof is preferably from 0.01 to 5% by weight, more preferably from 0.02 to 1% by weight, in the developer at the use.

<Other Effective Components>

Into the developer for use in the invention, an antiseptic agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the defoaming agent, for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium hydrogen sulfate and nickel sulfate are illustrated.

The developer described above can be used as a developer and a development replenisher for an exposed negative type lithographic printing plate precursor and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate making method of the lithographic printing plate precursor.

(Image-Recording Layer)

The image-recording layer (photosensitive layer) of the lithographic printing plate precursor according to the invention contains (A) a binder polymer, (B) a sensitizing dye, (C) a polymerization initiator and (D) a compound containing an ethylenically unsubstituted bond as the essential components. The photosensitive layer may further contain other components, if desired. The constituting components of the photosensitive layer will be described in detail below.

<(A) Binder Polymer>

The binder polymer containing at least one group capable of being converted to a sulfonate upon a reaction with the aqueous solution containing a sulfite and/or a bisulfite (hereinafter, also referred to as a sulfite and/or bisulfite developer) for use in the invention is described in detail below.

The group capable of being converted to a sulfonate upon a reaction with the sulfite and/or bisulfite developer may be any group or compound which can undergo a reaction, for example, a nucleophilic substitution reaction, an electrophilic addition reaction or an electrophilic substitution reaction with a sulfite and/or a bisulfite ion to form a sulfonate ion. As such groups, known groups can be used. For example, a bromine atom described in Organic Syntheses, Coll. Vol. 2, page 555 (1943); Vol. 10, page 96 (1930) is exemplified. From the standpoint of reactivity, a group selected from the group consisting of a group substituted with a halogen atom, for example, a chlorine atom, a bromine atom or an iodine atom, an unsaturated double bond group, for example, a vinyl group, an allyl group, an acrylate group or a methacrylate group, an unsaturated triple bond group, for example, a terminal and/or connected alkynyl group, an aldehyde group, a ketone group and a combination thereof is preferable. Particularly, from the standpoint of reactivity or the like, a group substituted with a halogen atom is preferable and group substituted with a bromine atom is most preferable.

It is preferred that the group capable of being converted to a sulfonate upon a reaction with the sulfite and/or bisulfite developer is present at a terminal of a side chain of the binder polymer.

The content of the group capable of being converted to a sulfonate upon a reaction with the sulfite and/or bisulfite developer in the binder polymer is preferably from 1 to 70% by mole. In consideration of the compatibility between developing property and printing durability, the content is more preferably from 1 to 50% by mole, particularly preferably from 1 to 30% by mole.

The binder polymer is preferably a copolymer. The content of the copolymerization component containing a group capable of being converted to a sulfonate upon a reaction with the sulfite and/or bisulfite developer is preferably from 1 to 70% by mole, more preferably from 1 to 50% by mole, still more preferably from 1 to 30% by mole, based on the total copolymerization component of the copolymer.

The binder polymer containing a group capable of being converted to a sulfonate upon a reaction with the sulfite and/or bisulfite developer is preferably a binder polymer capable of being developed with a developer having pH of 2 to 10. Such a binder is not particularly restricted and a binder polymer containing a hydrophilic group is preferable.

The hydrophilic group is selected from a monovalent and divalent hydrophilic groups and preferably includes, for instance, a hydroxy group, a sulfonic acid group, a carboxylic acid group, a phosphoric acid group, a carboxylate group, an alkyleneoxy group, for example, an ethyleneoxy group or a propyleneoxy group, an amino group, an amino group, an amino group, an ammonium group, an amido group, an ether group, and a salt formed by neutralization of an acid group, for example, a carboxylic acid group, a sulfonic acid group or a phosphoric acid group. An amino group, an ammonium group, an amido group, a hydroxy group, a —$CH_2CH_2O$— repeating unit and a —$CH_2CH_2NH$— repeating unit are more preferable and a tertiary amino group, a tertiary ammonium group and a quaternary ammonium group are most preferable. Especially, a tertiary ammonium group formed by neutralization of a tertiary amino group with an acid is preferable. It is preferred that the hydrophilic group is present at a terminal of a side chain of the binder polymer.

The content of the hydrophilic group in the binder polymer is preferably from 1 to 70% by mole in view of developing property. In consideration of the compatibility between developing property and printing durability, the content is more preferably from 1 to 50% by mole, particularly preferably from 1 to 30% by mole.

It is preferred that the binder polymer for use in the invention does not substantially contain a carboxylic acid group or a phosphoric acid group in view of developing property and stain resistance.

An acid value (acid content per g of polymer, indicated by the chemical equivalent number) of the binder polymer is preferably 0.3 meq/g or less, more preferably 0.1 meq/g or less.

The binder polymer for use in the invention is preferably insoluble in water and an aqueous solution having a pH of 10 or more. The solubility (polymer concentration at the saturation dissolution) of the binder polymer in water or an aqueous solution having a pH of 10 or more is preferably 10% by weight or less, more preferably 1.0% by weight or less. The temperature for measuring the above-described solubility is temperature at the plate making development and it is 25° C. herein.

The binder polymer (A) may be any of a random polymer, a block polymer, a graft polymer and the like.

The binder polymers (A) may be used individually or in combination of two or more thereof. The content of the binder polymer (A) is from 5 to 75% by weight, preferably from 10 to 70% by weight, more preferably from 10 to 60% by weight, based on the total solid content of the photosensitive layer from the standpoint of preferable strength of the image area and good image-forming property.

The total content of the polymerizable compound and the binder polymer is preferably 80% by weight or less based on the total solid content of the photosensitive layer. When it exceeds 80% by weight, decrease in sensitivity and deterioration in developing property may be caused sometimes. It is more preferably from 35 to 75% by weight.

The skeleton of the binder polymer is preferably a polymer selected from an acrylic resin, a polyvinyl acetal resin, a polyvinyl alcohol resin, a polyurethane resin, a polyamide resin, an epoxy resin, a methacrylic resin, a styrene-based resin and a polyester resin. Among them, a vinyl copolymer, for example, an acrylic resin, a methacrylic resin or a styrene-based resin and a polyurethane resin are particularly preferable.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

Specific examples of the binder polymer (A) are set forth below, but the invention should not be construed as being limited thereto. In the tables below, the molecular weight (Mw) is a weight average molecular weight measured by gel permeation chromatography (GPC) using polystyrene as a standard substance. Also, in the tables, the composition ratio or the numeral described below the compound in structural formulae PU-1 to PU-14 means a polymerization molar ratio (100% in total). Further, "PPG1000" means polypropylene glycol containing a propylene oxide unit as a repeating unit and having a number average molecular weight of 1,000 and "PEG2000" means polyethylene glycol containing a ethylene oxide unit as a repeating unit and having a number average molecular weight of 2,000.

| | Structure of Binder | Molecular Weight (×10000) |
|---|---|---|
| PA-1 | | 5.8 |
| PA-2 | | 6.6 |
| PA-3 | | 7.0 |
| PA-4 | | 5.8 |
| PA-5 | | 6.0 |
| PA-6 | | 5.5 |

-continued
| | Structure of Binder | Molecular Weight (×10000) |
|---|---|---|
| PA-7 | 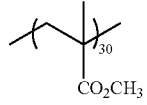 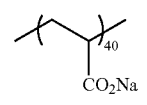 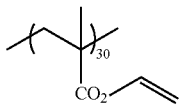 | 5.0 |
| PA-8 | 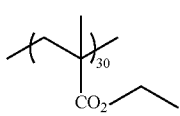 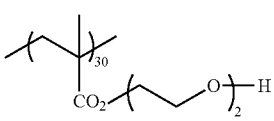 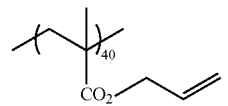 | 5.9 |
| PA-9 | 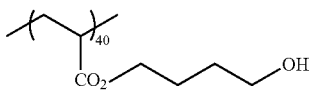 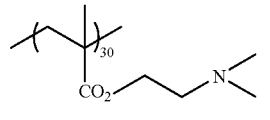 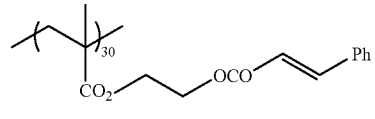 | 6.0 |
| PA-10 | 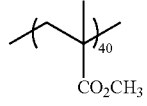 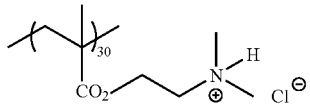 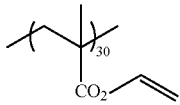 | 7.1 |
| PA-11 | 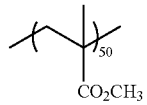 | 5.4 |
-continued
| | Structure of Binder | Molecular Weight (×10000) |
|---|---|---|
| | 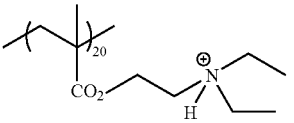 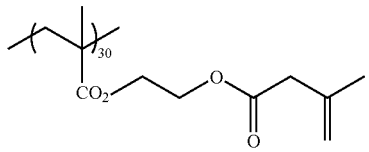  | |
| PA-12 | 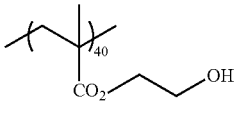 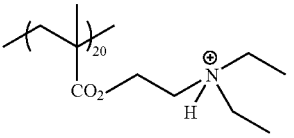 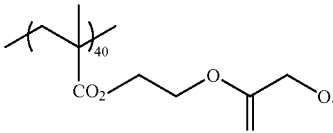  | 7.0 |
| PA-13 | 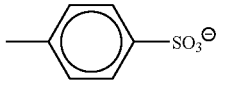 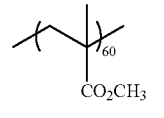 | 5.0 |

| Structure of Binder | Molecular Weight (×10000) |
|---|---|
| 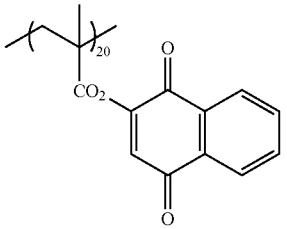 | |
| PA-14 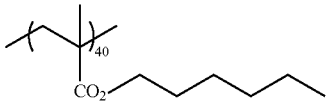 | 7.0 |
| Structure of Binder | Molecular Weight (×10000) |
|---|---|
| PV-1 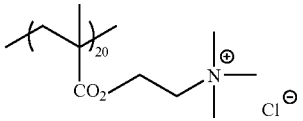 | 7.0 |
| Structure of Binder | Molecular Weight (×10000) |
|---|---|
| PV-2 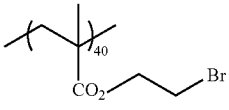 | 8.0 |
| PV-3 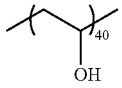 | 5.1 |

| | Structure of Diisocyanate | | Structure of Diol | | | Mw |
|---|---|---|---|---|---|---|
| PU-1 | OCN—C₆H₄—CH₂—C₆H₄—NCO  50 | PPG1000  10 | HOCH₂—C(CH₃)(CO₂Na)—CH₂OH  20 | HOCH₂—CH(OH)—CH₂Cl  20 | | 58000 |
| PU-2 | OCN—C₆H₄—CH₂—C₆H₄—NCO  40 | OCN—(CH₂)₆—NCO  10  PPG1000  10 | HOCH₂—C(CH₃)(CO₂Na)—CH₂OH  20 | HOCH₂—CH(OH)—CH₂Br  20 | | 54000 |
| PU-3 | OCN—C₆H₄—CH₂—C₆H₄—NCO  40 | OCN—(CH₂)₆—NCO  10  PPG1000  10 | HOCH₂—CH(OH)—CH₂—N(Et)₂  30 | HOCH₂—CH(OH)—CH₂Cl  10 | | 52000 |
| PU-4 | OCN—C₆H₄—CH₂—C₆H₄—NCO  40 | OCN—(CH₂)₆—NCO  10  PPG1000  10 | camphorsulfonate / HOCH₂—CH(OH)—CH₂—N⁺H(Et)₂ ⁻O₃S-camphor  25 | HOCH₂—CH(OH)—CH₂Br  15 | | 67000 |
| PU-5 | OCN—C₆H₄—CH₂—C₆H₄—NCO  40 | OCN—(CH₂)₆—NCO  10  PPG1000  10 | camphorsulfonate / HOCH₂—CH(OH)—CH₂—N⁺H(Et)₂ ⁻O₃S-camphor  30 | HOCH₂—C(CH₂Br)₂—CH₂OH  10 | | 50000 |

-continued

| | Structure of Diisocyanate | | Structure of Diol | | | Mw |
|---|---|---|---|---|---|---|
| PU-6 | OCN–C₆H₄–CH₂–C₆H₄–NCO  50 | PEG100  10 | Br-CH₂-CH(OH)-CH₂-OH  40 | | | 56000 |
| PU-7 | OCN–C₆H₄–CH₂–C₆H₄–NCO  40 | OCN–(CH₂)₆–NCO PPG1000  10 | camphorsulfonate  10 | HO-CH₂-CH(OH)-CH₂-N⁺(Et)₂H ⁻O₃S-  30 | glycerol methacrylate  10 | 62000 |
| PU-8 | OCN–C₆H₄–CH₂–C₆H₄–NCO  40 | OCN–(CH₂)₆–NCO PPG1000  10 | HO-CH₂-CH₂-N(CH₂CH₂OH)-CH₂CH₂-SO₃Na  10 | allyl glyceryl ether  30 | | 58000 |
| PU-9 | OCN–C₆H₄–CH₂–C₆H₄–NCO  40 | OCN–(CH₂)₆–NCO PPG1000  10 | HO-CH₂-CH₂-N(CH₂CH₂OH)-CH₂CH₂-SO₃Na  10 | glyceryl cinnamate  30 | | 63000 |
| PU-10 | OCN–C₆H₄–CH₂–C₆H₄–NCO  40 | OCN–(CH₂)₆–NCO PPG1000  10 | camphorsulfonate  10 | HO-CH₂-CH(OH)-CH₂-N⁺(Et)₂H ⁻O₃S-  30 | cytosine-amide diol  10 | 58000 |

| | Structure of Diisocyanate | | Structure of Diol | | Mw |
|---|---|---|---|---|---|
| PU-11 | 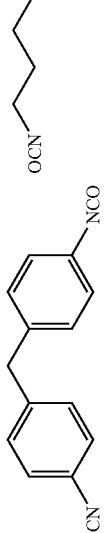 40 | 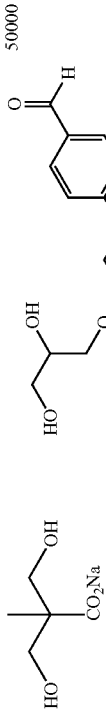 NCO PEG2000 10 | 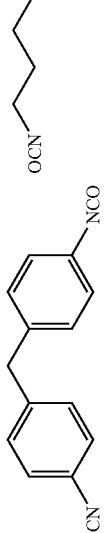 40 | | 55000 |
| PU-12 | 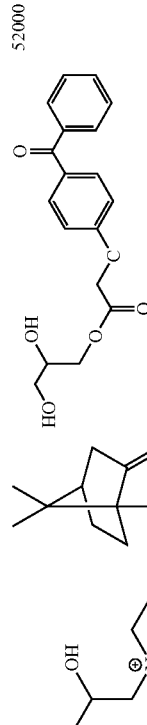 40 | NCO PPG1000 10 | HO—CH₂—C(CH₃)(CO₂Na)—CH₂—OH 25 | 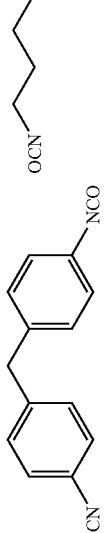 15 | 50000 |
| PU-13 | 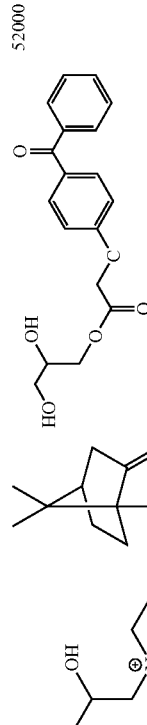 40 | NCO PPG1000 10 | camphorsulfonate triethylammonium diol 25 | 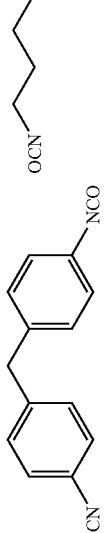 15 | 52000 |
| PU-14 | 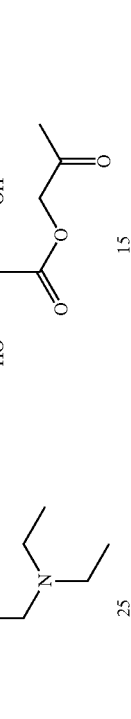 50 | PPG1000 10 | HO—CH₂—CH(OH)—CH₂—N(Et)₂ 25 | bis(hydroxymethyl)propionate ketone diol 15 | 53000 |

Further, a polymer (hereinafter, also referred to as an "additional polymer") which does not contain a group capable of being converted to a sulfonate upon a reaction with the sulfite and/or bisulfite developer may be added to the photosensitive layer according to the invention in addition to the binder polymer described above.

As the additional polymer mixable in the photosensitive layer according to the invention, a polymer containing a hydrophilic group can be used in view of developing property.

Preferable specific examples of the hydrophilic group and composition ratio in the copolymer are same as those described in the binder polymer described above.

The additional polymer is preferably a copolymer. The content of the copolymerization component containing a hydrophilic group is preferably from 1 to 70% by mole based on the total copolymerization component of the copolymer from the standpoint of developing property. In consideration of the compatibility between developing property and printing durability, the content is more preferably from 1 to 50% by mole, particularly preferably from 1 to 30% by mole.

The skeleton of the additional polymer is preferably a polymer selected from an acrylic resin, a polyvinyl acetal resin, a polyvinyl alcohol resin, a polyurethane resin, a polyamide resin, an epoxy resin, a methacrylic resin, a styrene-based resin and a polyester resin. Among them, a vinyl copolymer, for example, an acrylic resin, a methacrylic resin, a polyvinyl alcohol resin or a styrene-based resin and a polyurethane resin are particularly preferable.

The additional polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The content of the additional polymer when it is used is preferably from 1 to 50% by weight, particularly preferably from 1 to 30% by weight, based on the total content of the binder polymer described above and the additional polymer.

Specific examples of the additional polymer are set forth below, but the invention should not be construed as being limited thereto. In the tables below, the weight average molecular weight (Mw) was measured by gel permeation chromatography (GPC) using polystyrene as a standard substance.

| Polymer No. | Structure of Binder (% by mole) | Molecular Weight |
|---|---|---|
| P-1 | (methyl methacrylate 90 / acrylate anion 10 / diethylammonium ethyl methacrylate) | 80000 |
| P-2 | (methyl methacrylate 95 / acrylamide-SO$_3$Na 5) | 72000 |

| Polymer No. | Diisocyanate Compound Used (% by mole) | Diol Compound Used (% by mole) | Molecular Weight |
|---|---|---|---|
| P-3 | isophorone diisocyanate 70 / hexamethylene diisocyanate 30 | HO—(CH$_2$CH(CH$_3$)—O)—H (Mw = 400) 40 / diol with COO$^-$ HN$^+$Et$_3$ 30 | 60000 |

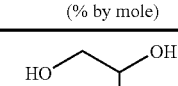

-continued
| Polymer No. | Structure of Binder (% by mole) | Molecular Weight |
|---|---|---|
| P-9 | 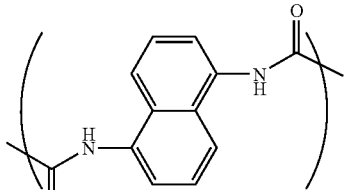 | 60000 |
| Polymer No. | Structure of Binder | Composition Ratio | Molecular Weight |
|---|---|---|---|
| P-10 | 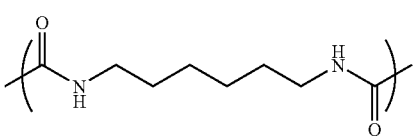 | 90/10 | 70000 |
| P-11 | 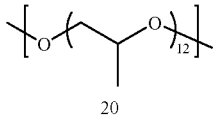 | 90/5/5 | 80000 |
| P-12 | 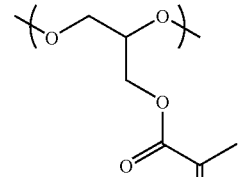 | 60/35/5 | 80000 |
| Polymer No. | Diisocyanate Compound Used (% by mole) | Diol Compound Used (% by mole) | Molecular Weight |
|---|---|---|---|
| P-13 | 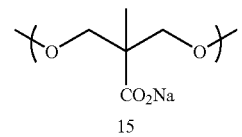 | 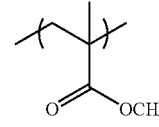 | 57000 |

-continued
| Polymer No. | Diisocyanate Compound Used (% by mole) | Diol Compound Used (% by mole) | Molecular Weight |
|---|---|---|---|
| | 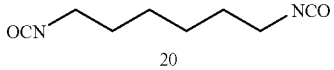<br>20 | 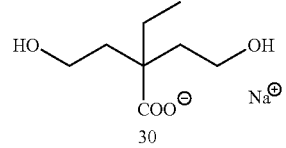<br>30<br><br>HO—(CH$_2$CH—O)$_n$—H<br>              CH$_3$<br>(Mw = 400)<br>40 | |
| Polymer No. | Structure of Binder | Composition Ratio | Molecular Weight |
|---|---|---|---|
| P-14 | 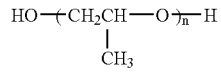 | 90/10 | 70000 |
| P-15 | 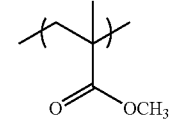 | 90/10 | 58000 |
| P-16 | 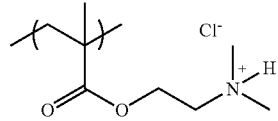 | 90/10 | 90000 |
| P-17 | 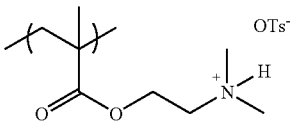 | 70/30 | 62000 |

-continued

| Polymer No. | Structure of Binder | Composition Ratio | Molecular Weight |
|---|---|---|---|
| P-18 | (structures shown) | 70/30 | 58000 |
| P-19 | (structures shown) | 50/25/25 | 49000 |

| Polymer No. | Structure of Diisocyanate | Dicarboxylic acid | Structure of Diol | Diamine | | Mw |
|---|---|---|---|---|---|---|
| P-20 | OCN-C6H4-CH2-C6H4-NCO / 40 | OCN-(CH2)5-NCO / 10 | PPG1000 / 10 | HO-CH2-CH(OH)-CH2-N+(CH3)3 Cl− / 25 | HO-CH2-CH(OH)-CH2-O-C(O)-C(=CH2)CH3 / 15 | 59000 |
| P-21 | OCN-C6H4-CH2-C6H4-NCO / 40 | OCN-(CH2)5-NCO / 10 | PPG1000 / 10 | HO-CH2-CH(OH)-CH2-N(CH3)2 / 25 | HO-CH2-CH(OH)-CH2-O-C(O)-C(=CH2)CH3 / 15 | 59000 |
| P-22 | OCN-C6H4-CH2-C6H4-NCO / 40 | OCN-(CH2)5-NCO / 10 | PPG1000 / 10 | camphorsulfonate ammonium diol / 25 | HO-CH2-CH(OH)-CH2-O-C(O)-C(=CH2)CH3 / 15 | 62000 |
| P-23 | OCN-C6H4-CH2-C6H4-NCO / 40 | OCN-(CH2)5-NCO / 10 | HO-(CH2)n-O-C(O)-(CH2)m-OH / 10 | camphorsulfonate ammonium diol / 25 | HO-CH2-CH(OH)-CH2-O-C(O)-C(=CH2)CH3 / 15 | 53000 |

| Polymer No. | Structure of Binder (% by mole) | Mw |
|---|---|---|
| P-24 | 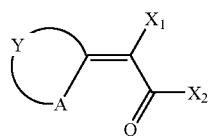 | 80000 |
| P-25 | | 100000 |

<(B) Sensitizing Dye>

The sensitizing dye for use in the photosensitive layer according to the invention is appropriately selected depending on the use or the like and is not particularly restricted. For instance, a compound absorbing light of 360 to 450 nm and an infrared absorbing agent are exemplified.

(1) Compound Absorbing Light of 360 to 450 nm

The sensitizing dye having an absorption maximum in a wavelength range of 360 to 450 nm for use in the invention includes merocyanine dyes represented by formula (V) shown below, benzopyranes or coumarins represented by formula (VI) shown below, aromatic ketones represented by formula (VII) shown below and anthracenes represented by formula (VIII) shown below.

(V)

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

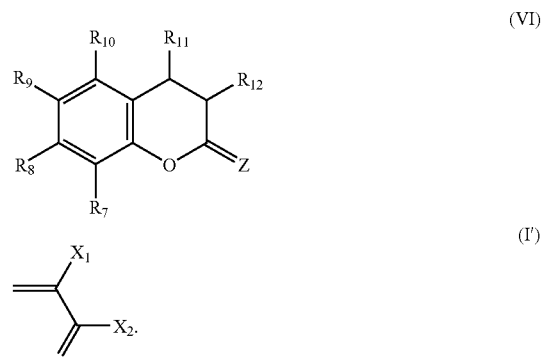

In formula (VI), =Z represents an oxo group, a thioxo group, an imino group or an alkylydene group represented by the partial structural formula (I') described above, $X_1$ and $X_2$ have the same meanings as defined in formula (V) respectively, and $R_7$ to $R_{12}$ each independently represents a monovalent non-metallic atomic group.

In formula (VII), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

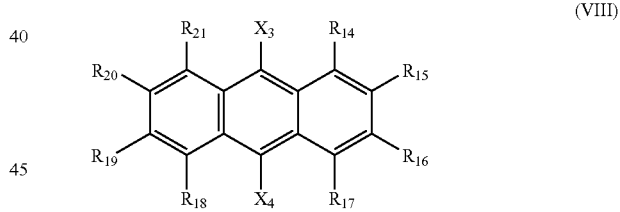

In formula (VIII), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (V) to (VIII), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthioethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[2,1]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoseleriazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 360 to 450 nm, dyes represented by formula (IX) shown below are more preferable in view of high sensitivity.

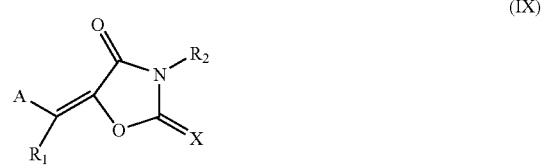

(IX)

In formula (IX), A represents an aromatic cyclic group which may have a substituent or a heterocyclic group which may have a substituent, X represents an oxygen atom, a sulfur atom or =N(R$_3$), and R$_1$, R$_2$ and R$_3$ each independently represents a hydrogen atom or a monovalent non-metallic atomic group, or A and R$_1$ or R$_2$ and R$_3$ may be combined with each other to form an aliphatic or aromatic ring.

The formula (IX) will be described in more detail below. R$_1$, R$_2$ and R$_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of R$_1$, R$_2$ and R$_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable substituted or unsubstituted alkenyl group and the preferable substituted or unsubstituted aromatic heterocyclic residue represented by any one of $R_1$, $R_2$ and $R_3$ include those described with respect to the alkenyl group and heteroaryl group above, respectively.

Next, A in formula (IX) will be described below. A represents an aromatic cyclic group which may have a substituent or heterocyclic group which may have a substituent. Specific examples of the aromatic cyclic group which may have a substituent and heterocyclic group which may have a substituent include those described for any one of $R_1$, $R_2$ and $R_3$ in formula (IX).

The sensitizing dye represented by formula (IX) is obtained by a condensation reaction of the above-described acidic nucleus or an active methyl group-containing acidic nucleus with a substituted or unsubstituted, aromatic ring or hetero ring and can be synthesized with reference to the description of JP-B-59-28329.

Preferable specific examples (D1) to (D75) of the compound represented by formula (IX) are set forth below. Further, when isomers with respect to a double bond connecting an acidic nucleus and a basic nucleus are present in each of the compounds, the invention should not be construed as being limited to any one of the isomers.

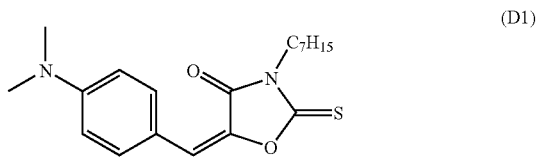
(D1)

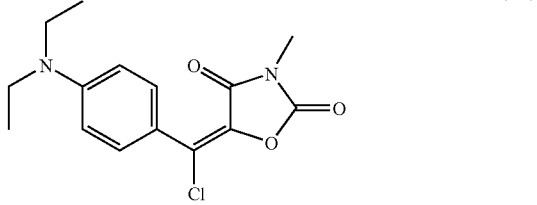
(D2)

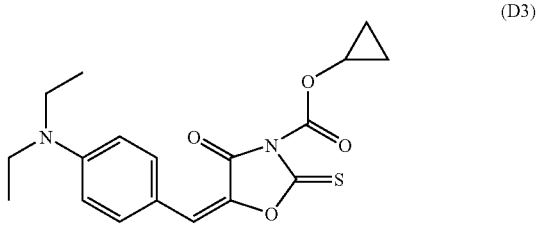
(D3)

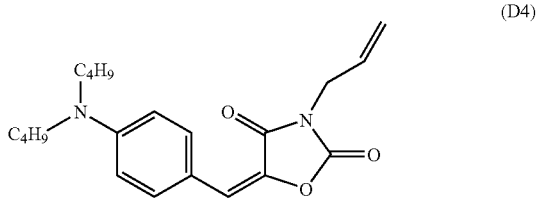
(D4)

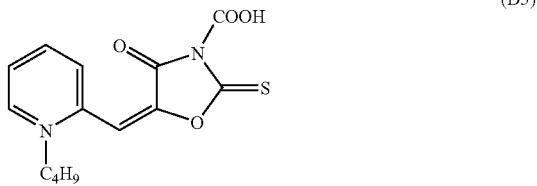
(D5)

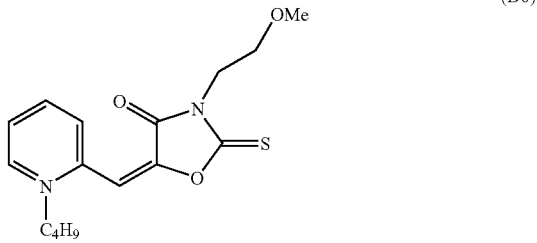
(D6)

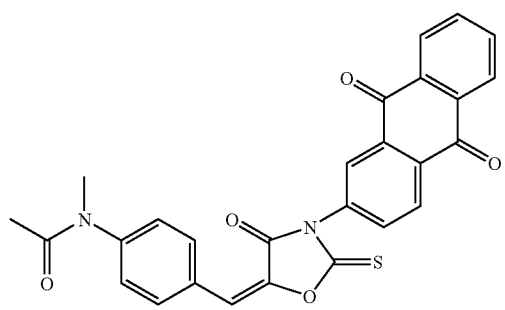
(D7)
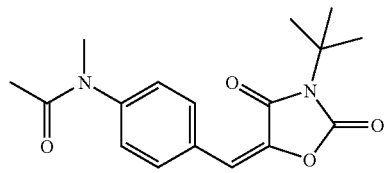
(D8)
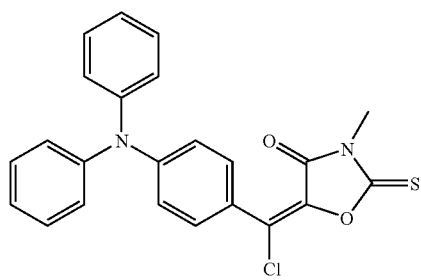
(D9)
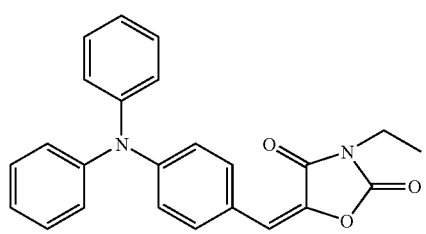
(D10)
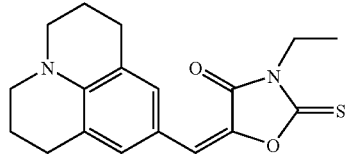
(D11)
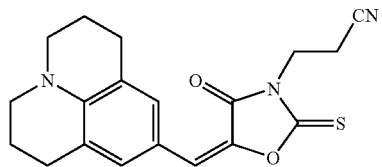
(D12)
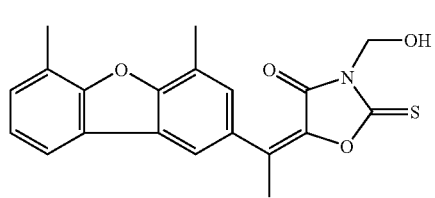
(D13)
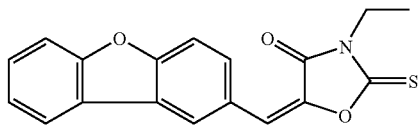
(D14)
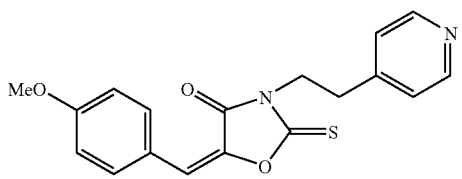
(D15)
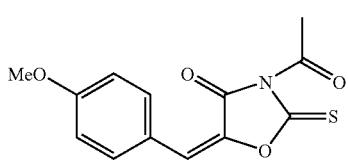
(D16)
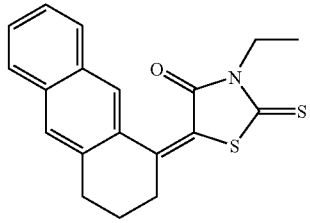
(D17)
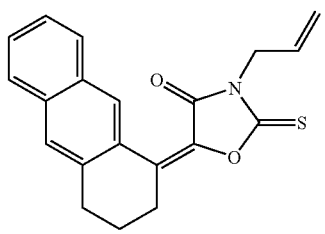
(D18)
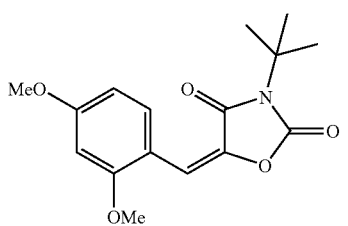
(D19)
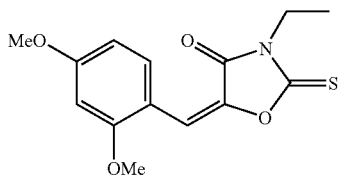
(D20)
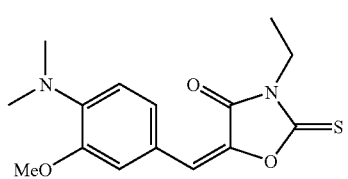
(D21)

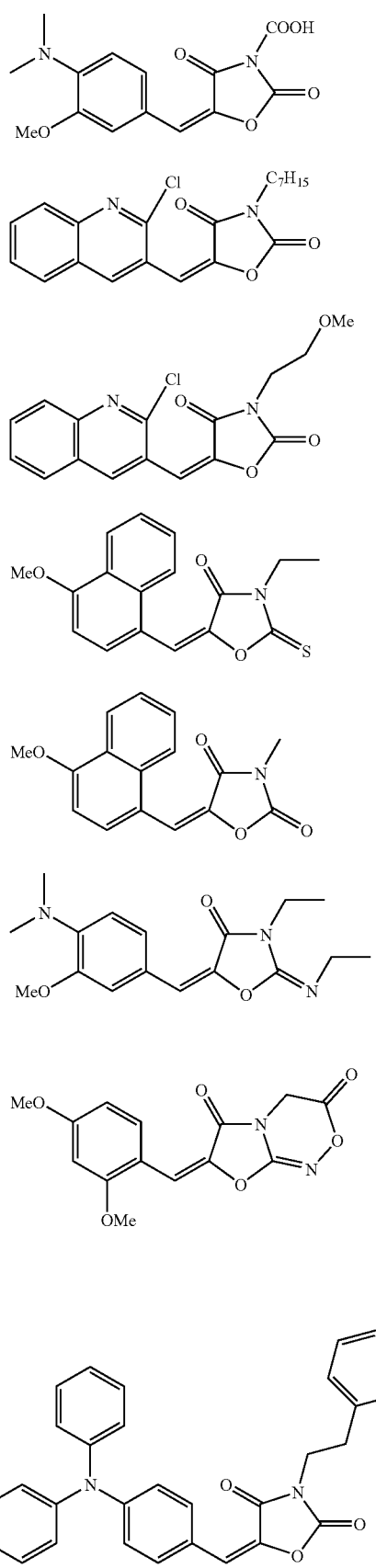
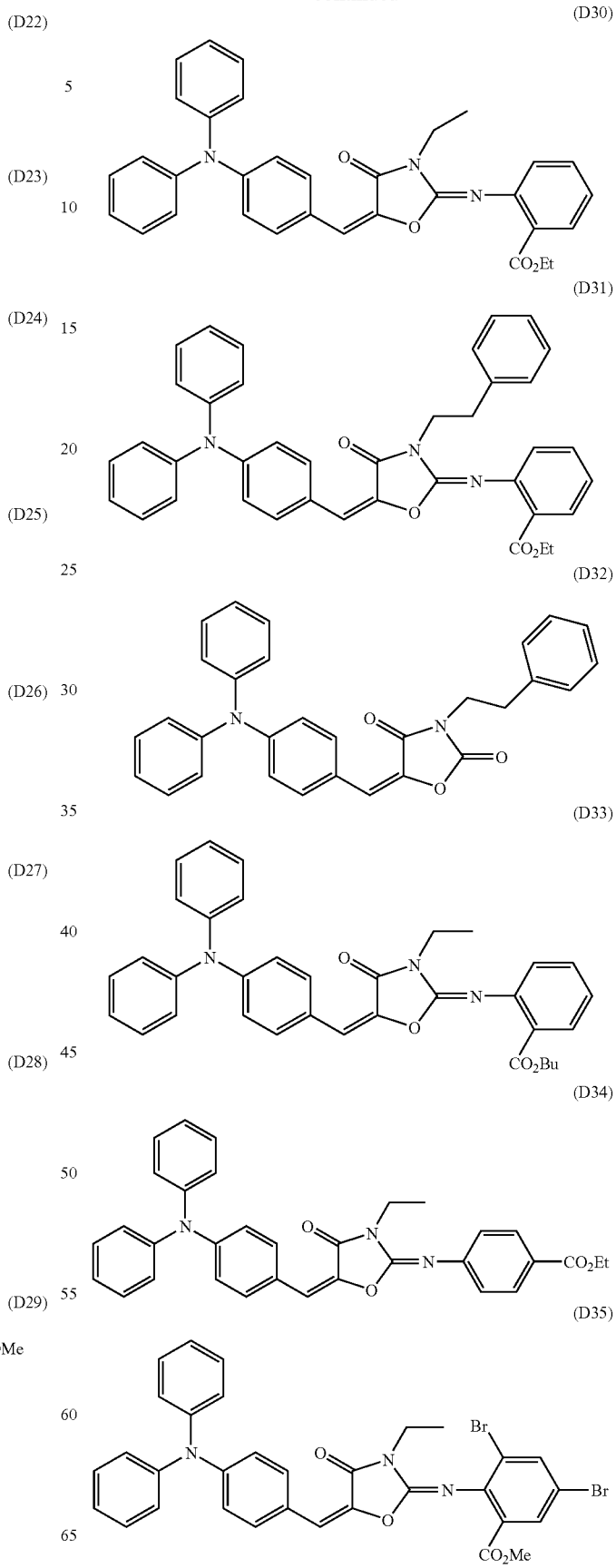

(D36)
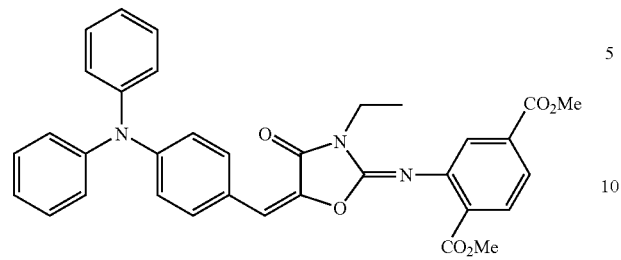
(D37)
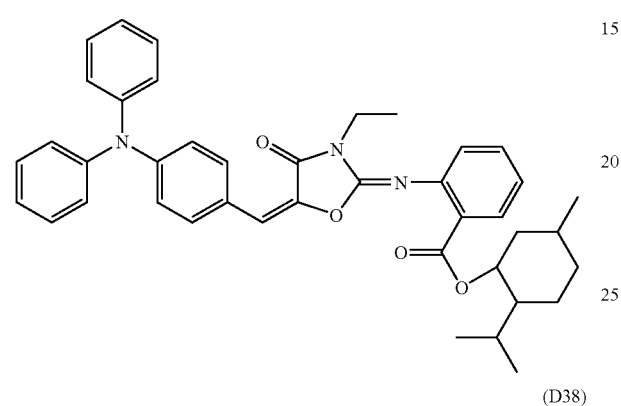
(D38)
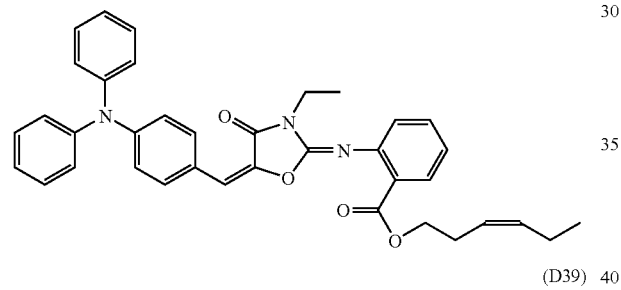
(D39)
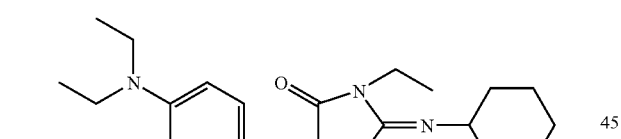
(D40)
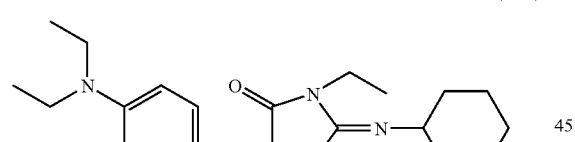
(D41)
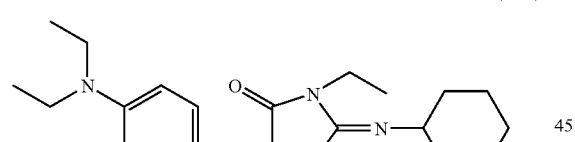
(D42)
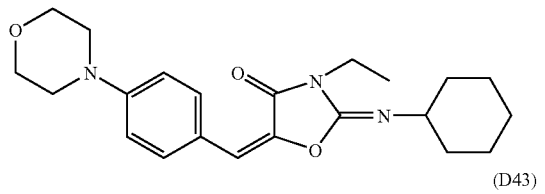
(D43)
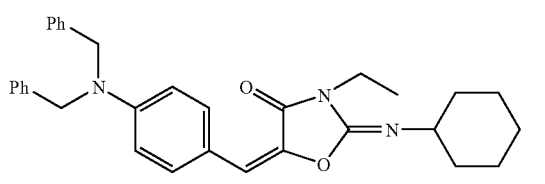
(D44)
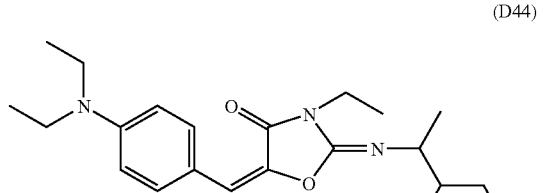
(D45)
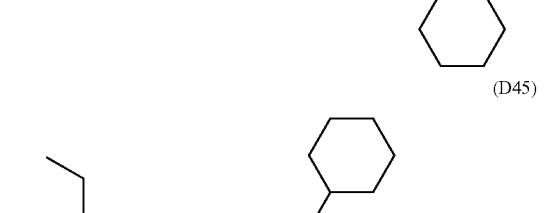
(D46)
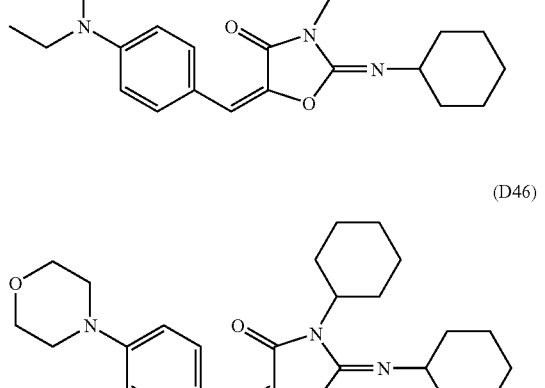
(D47)
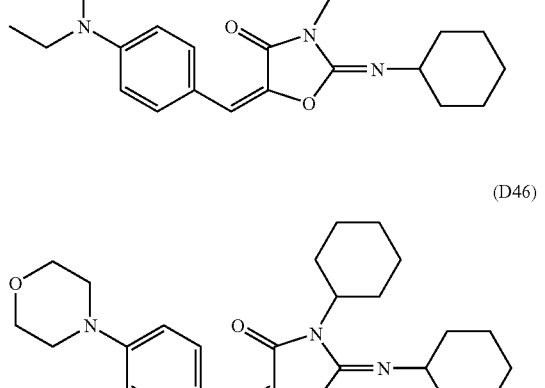
(D48)
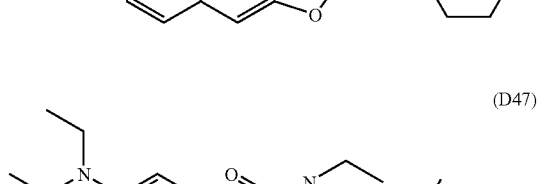

(D49)
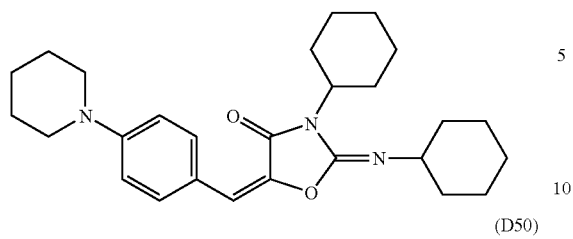
(D50)
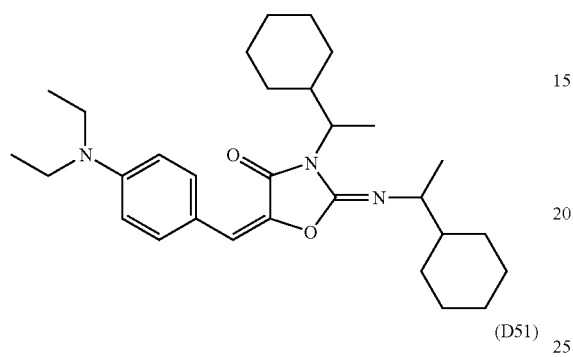
(D51)
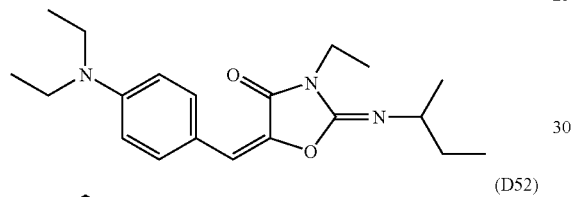
(D52)
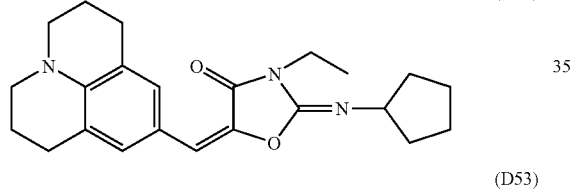
(D53)
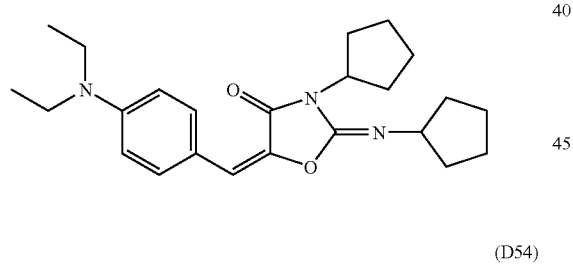
(D54)
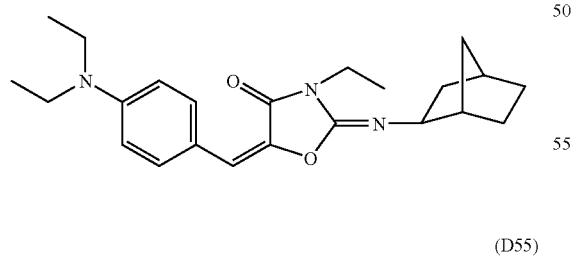
(D55)
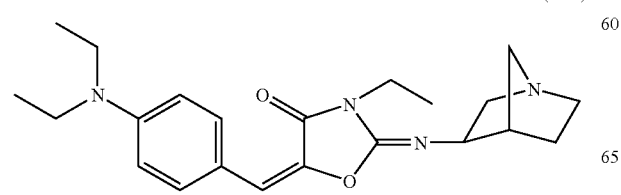
(D56)
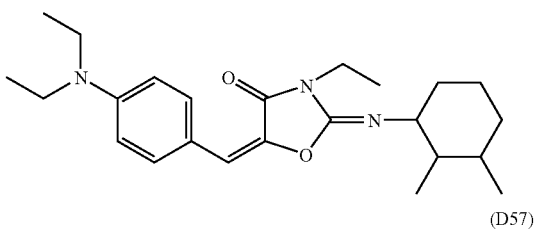
(D57)
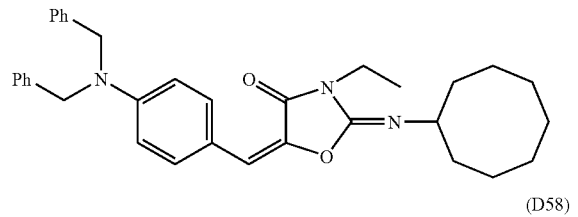
(D58)
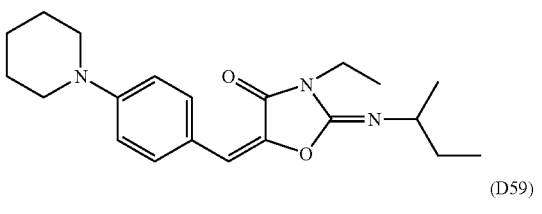
(D59)
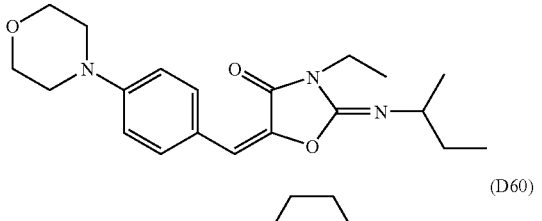
(D60)
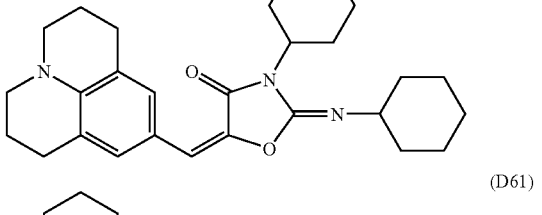
(D61)
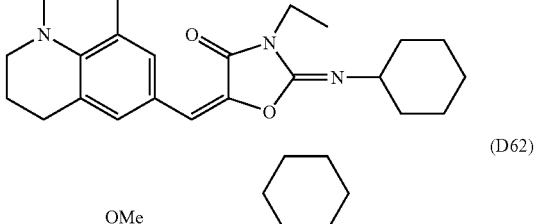
(D62)
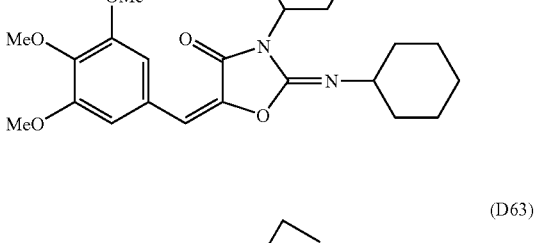
(D63)
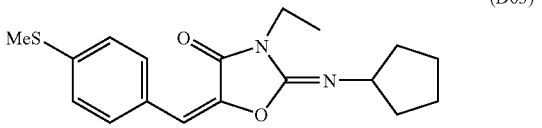

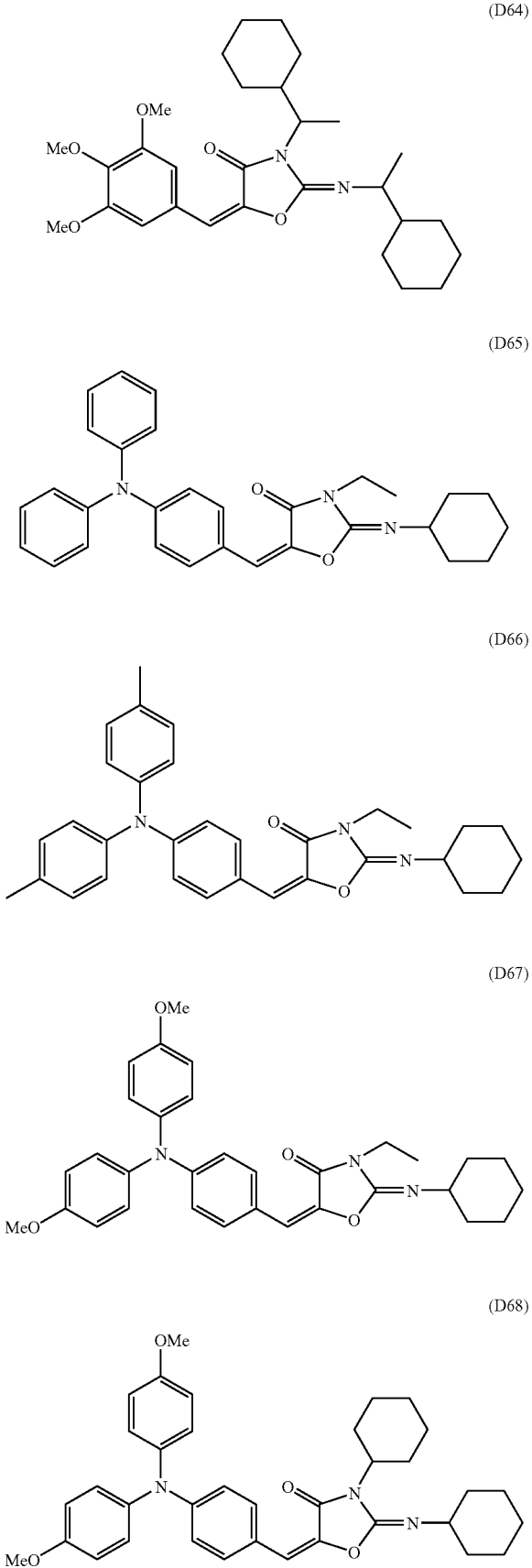
Details of the method of using the sensitizing dye, for example, selection of the structure, individual or combination use or an amount added, can be appropriately determined in accordance with the characteristic design of the final lithographic printing plate precursor.

For instance, when two or more sensitizing dyes are used in combination, the compatibility thereof in the photosensitive layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the photosensitive layer. Since the photosensitivity and resolution of the photosensitive layer and the physical properties of the exposed area of the photosensitive layer are greatly influenced by the absorbance of sensitizing dye at the wavelength of light source, the amount of the sensitizing dye added is appropriately determined by taking account of these factors.

However, for the purpose of curing a layer having a large thickness, for example, of 5 μm or more, low absorbance is sometimes rather effective for increasing the curing degree. In the case of using in a lithographic printing plate precursor where the photosensitive layer has a relatively small thickness, the amount of the sensitizing dye added is preferably selected such that the photosensitive layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, most preferably from 0.2 to 10 parts by weight, per 100 parts by weight of the total solid content of the photosensitive layer.

(2) Infrared Absorbing Agent

The infrared absorbing agent is a component used for increasing sensitivity to an infrared laser. The infrared absorbing agent has a function of converting the infrared ray absorbed to heat. The infrared absorbing agent for use in the invention is preferably a dye or pigment having an absorption maximum in a wavelength range of 760 to 1,200 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) in U.S. Pat. No. 4,756,993.

Other preferable examples of the infrared absorbing dye include specific indolenine cyanine dyes described in JP-A-2002-278057 as illustrated below.

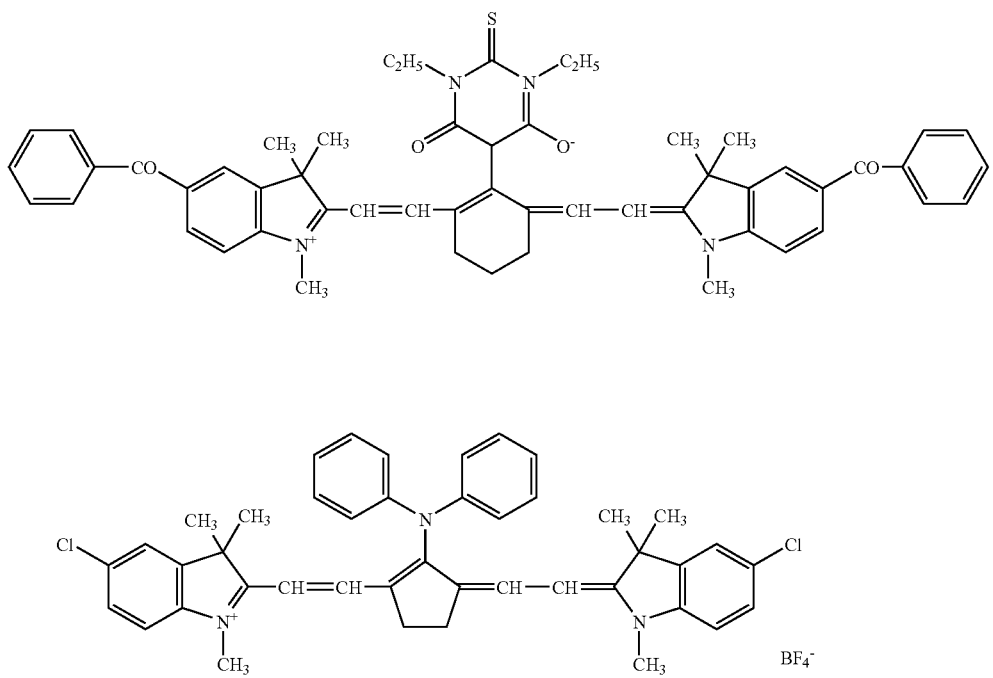

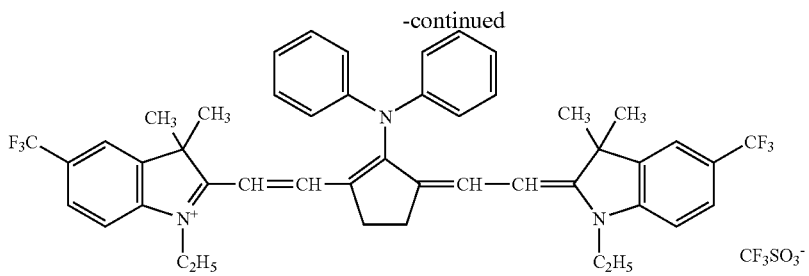

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by the following formula (I) is exemplified.

Formula (1):

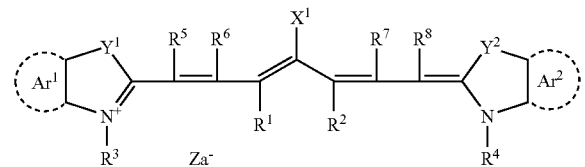

In formula (1), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates here a nitrogen atom, a sulfur atom, an oxygen atom, a halogen atom or a selenium atom.

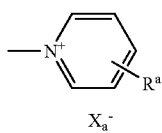

(wherein $Xa^-$ has the same meaning as $Za^-$ defined hereinafter. $R^a$ represents a substituent selected from a hydrogen atom, an alkyl group, an aryl group, a substituted or unsubstituted amino group and a halogen atom.)

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (I) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (I), which can be preferably used in the invention, include those described in Paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in *Colour Index (C.I.)*, *Saishin Ganryo Binran* (*Handbook of the Newest Pigments*) compiled by Pigment Technology Society of Japan (1977), *Saishin Ganryo Oyou Gijutsu* (*Newest Application on Technologies for Pigments*), CMC Publishing Co., Ltd. (1986) and *Insatsu Ink Gijutsu* (*Printing Ink Technology*), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (*Properties and Applications* of Metal Soap), Saiwai Shobo, Insatsu Ink Gijutsu (Printing Ink Technology), CMC Publishing Co., Ltd. (1984) and Saishin Ganryo Oyo Gijutsu (Newest Application on Technologies for Pigments), CMC Publishing Co., Ltd. (1986).

The pigment has a particle size of preferably from 0.01 to 10 μm, more preferably from 0.05 to 1 μm, particularly preferably from 0.1 to 1 μm. In the range described above, good stability and good uniformity of the pigment dispersion in the photosensitive layer can be obtained.

For dispersing the pigment, known dispersion techniques for use in the production of ink or toner may be used. Examples of the dispersing machine include an ultrasonic dispersing machine, a sand mill, an attritor, a pearl mill, a super-mill, a ball mill, an impeller, a disperser, a KD mill a colloid mill, a dynatron, a three roll mill and a pressure kneader. The dispersing machines are described in detail in Saishin Ganryo Oyo Gijutsu (Newest Application on Technologies for Pigments), CMC Publishing Co., Ltd. (1986).

The infrared absorbing agent may be added by being incorporated into a microcapsule.

With respect to the amount of the infrared absorbing agent added, the amount is so controlled that absorbance of the photosensitive layer at the maximum absorption wavelength in the wavelength region of 760 to 1,200 nm measured by reflection measurement is in a range of 0.3 to 1.3, preferably in a range of 0.4 to 1.2. In the range described above, the polymerization reaction proceeds uniformly in the thickness direction of the photosensitive layer and good film strength of the image area and good adhesion property of the image area to a support are achieved.

The absorbance of the photosensitive layer can be controlled depending on the amount of the infrared absorbing agent added to the photosensitive layer and the thickness of the photosensitive layer. The measurement of the absorbance can be carried out in a conventional manner. The method for measurement includes, for example, a method of forming a photosensitive layer having a thickness determined appropriately in the range necessary for the lithographic printing plate precursor on a reflective support, for example, an aluminum plate, and measuring reflection density of the photosensitive layer by an optical densitometer or a spectrophotometer according to a reflection method using an integrating sphere.

<(C) Polymerization Initiator>

The Polymerization initiator (C) for use in the photosensitive layer according to the invention is a compound which generates a radical with light energy or heat energy to initiate or accelerate polymerization of a compound having a polymerizable unsaturated group. The polymerization initiator is appropriately selected to use, for example, from known radical polymerization initiators and compounds containing a bond having small bond dissociation energy.

The radical polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., Bull. Chem. Soc. Japan, 42, 2924 (1969), U.S. Pat. No. 3,905,815, JP-B46-4605, JP-A48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, Journal of Heterocyclic Chemistry, 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxazole derivatives in which at least one of mono-, di- or tri-halogen substituted methyl group is connected to the oxazole ring are exemplified. Specific examples thereof include 2,4,6-tris(monochloromethyl)-s-triazine, 2,4,6-tris(dichloromethyl)-s-trazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and compounds shown below.

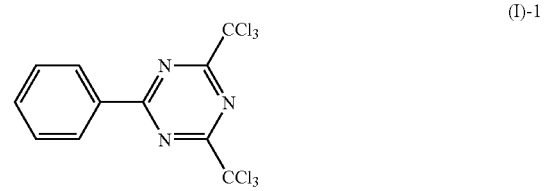

(I)-1

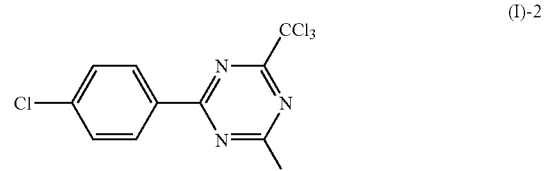

(I)-2

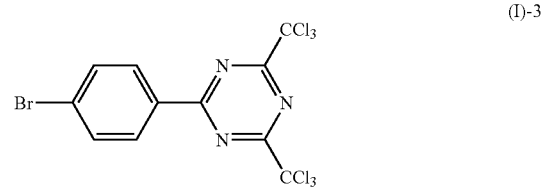

(I)-3

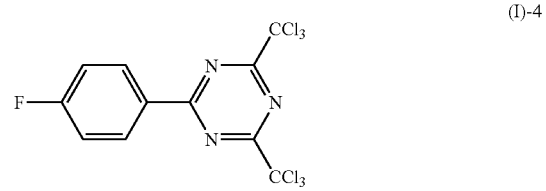

(I)-4

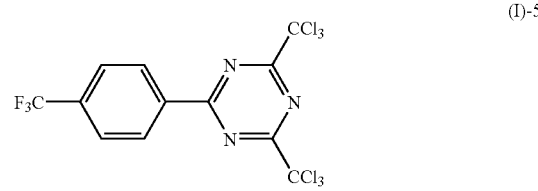

(I)-5

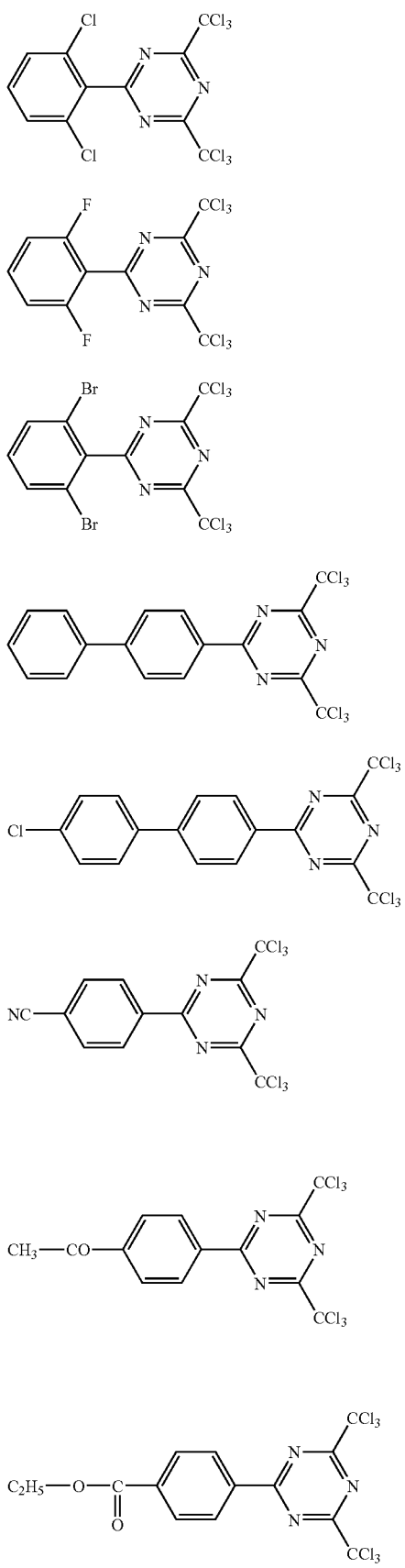
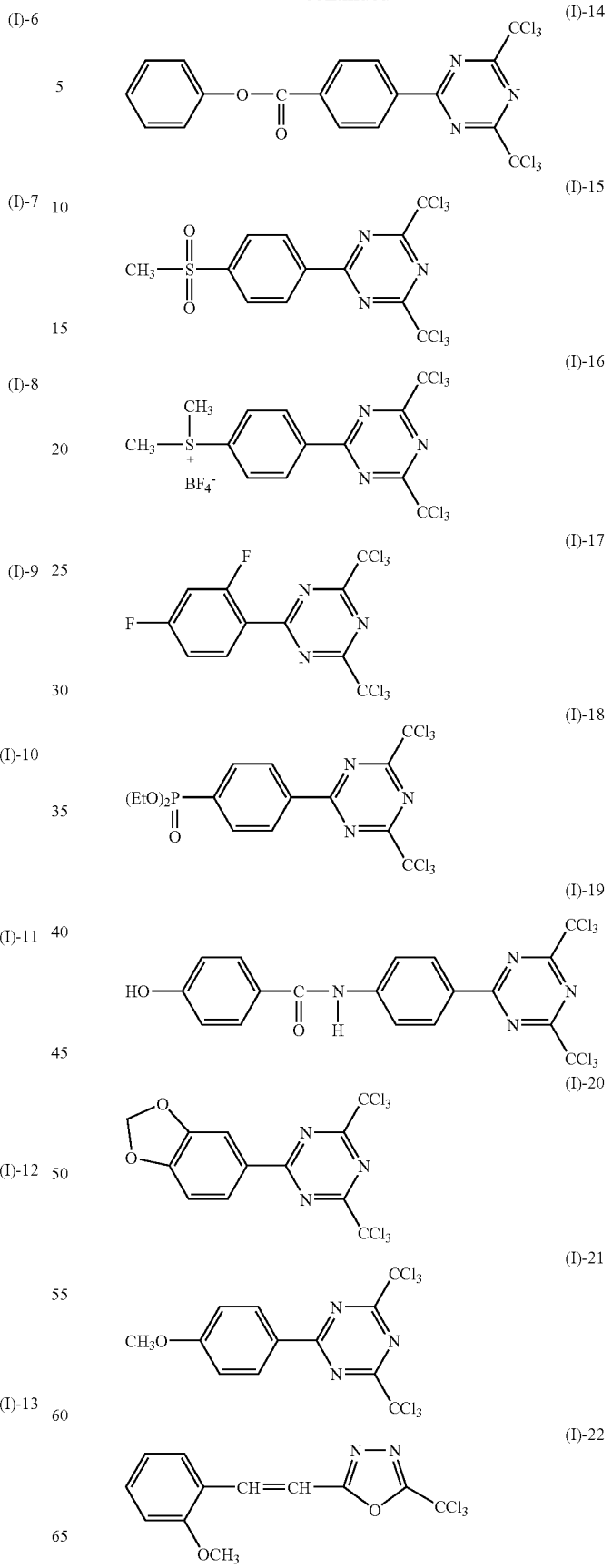

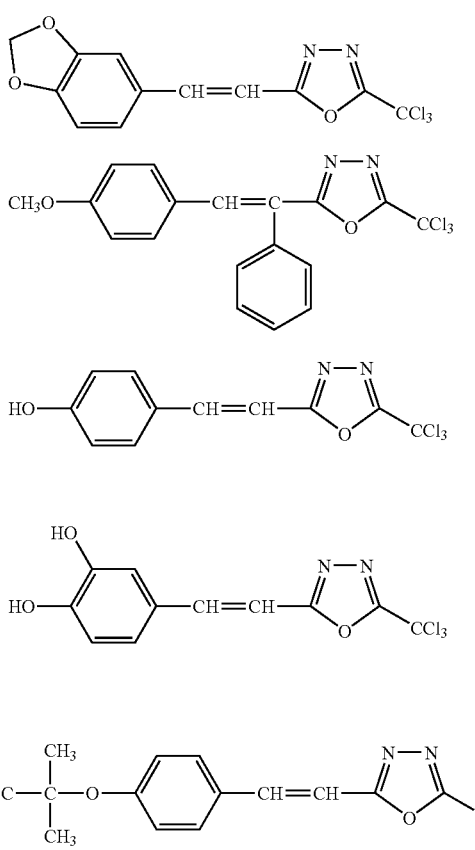

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1-trichloromethyl-(p-butylphenyl)ketone, thioxantone derivatives, e.g., thioxantone, 2-ethylthioxantone, 2-isopropylthioxantone, 2-chlorothioxantone, 2,4-dimetylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-24705 and JP-A-5-83588, for example, dicyclopentadienyl-Ti-bisphenyl dicyclopentadienyl-Ti-bis-2,6-difluorophen-1-yl dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl) titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, Rad Tech '98. Proceeding, Apr. 19-22, 1998, Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in J. C. S. Perkin II, 1653-1660 (1979), J. C. S. Perkin II, 156-162 (1979), Journal of Photopolymer Science and Technology, 202-232 (1995) and JP-A-2000-66385, and compounds described in JP-A-2000-80068. Specific examples thereof include compounds represented by the following structural formulae:

65
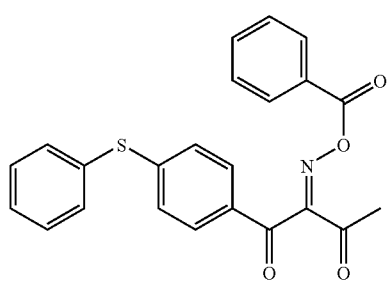
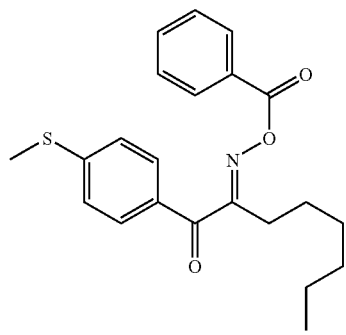
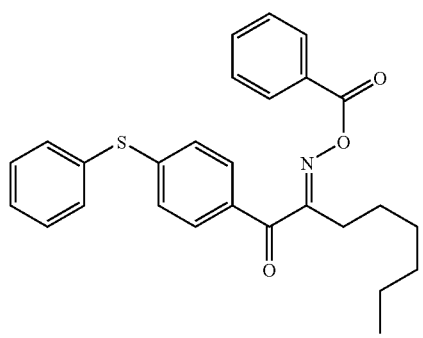
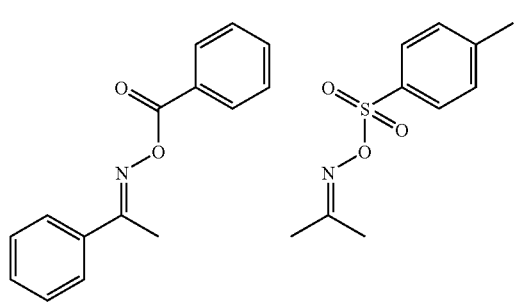
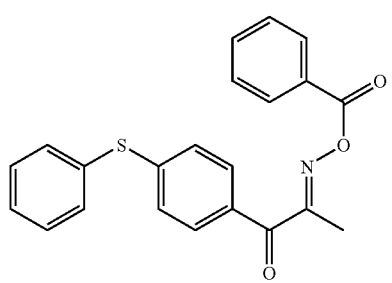
66
-continued
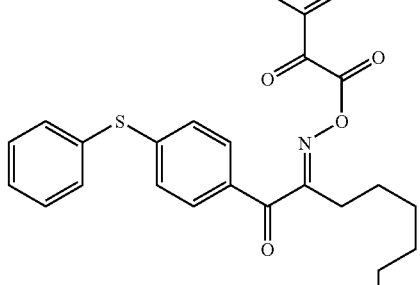
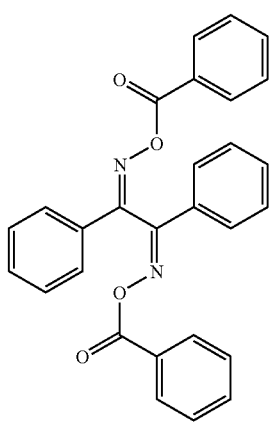
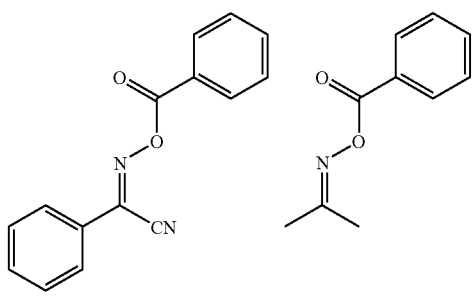
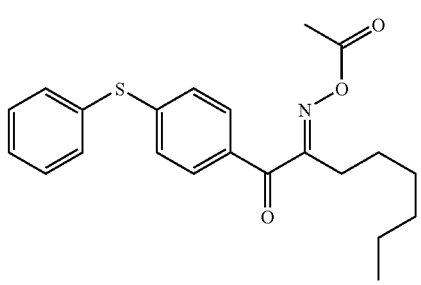
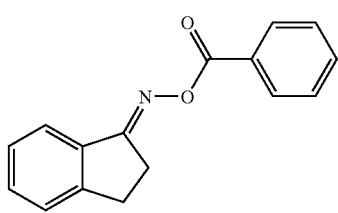

67
-continued

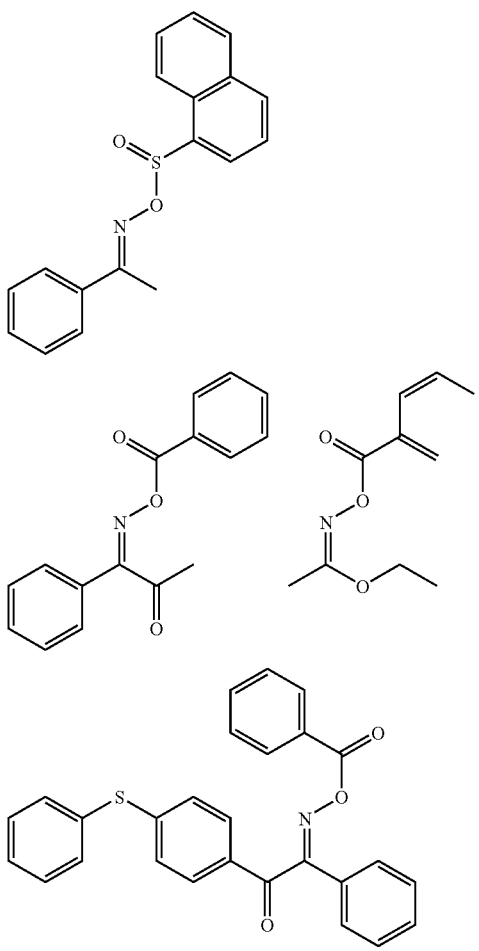

68
-continued

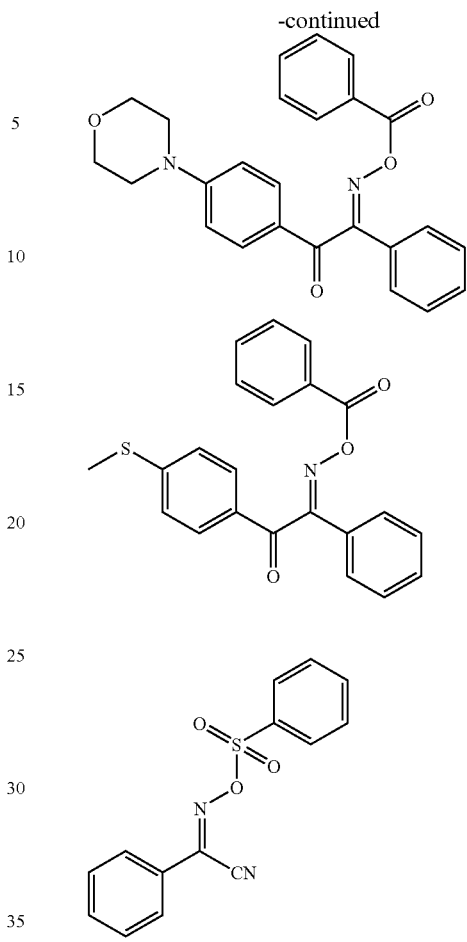

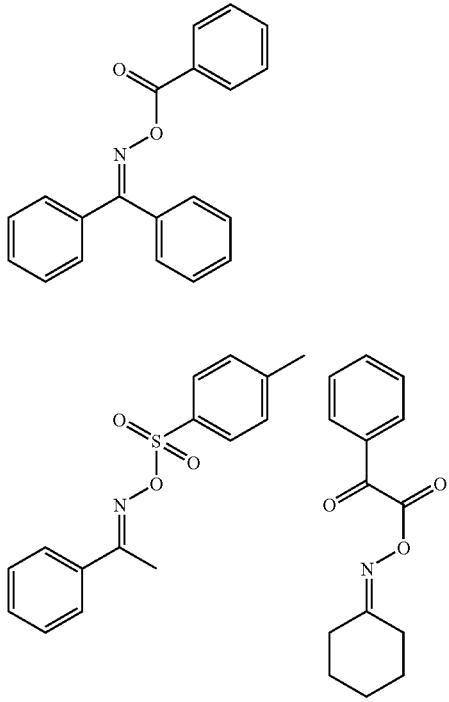

The onium salt compounds described above include onium salts, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370, 693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA,* p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

$$Ar_{11}-N^+\equiv NZ_{11}^- \tag{RI-I}$$

$$Ar_{21}-I^+-Ar_{22}Z_{21}^- \tag{RI-II}$$

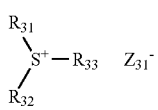
(RI-III)

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt are set forth below, but the invention should not be construed as being limited thereto.

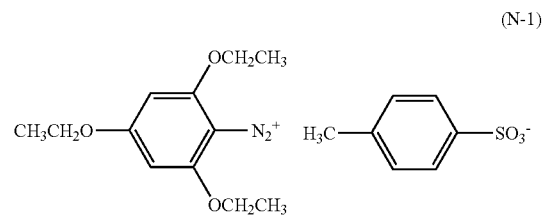
(N-1)

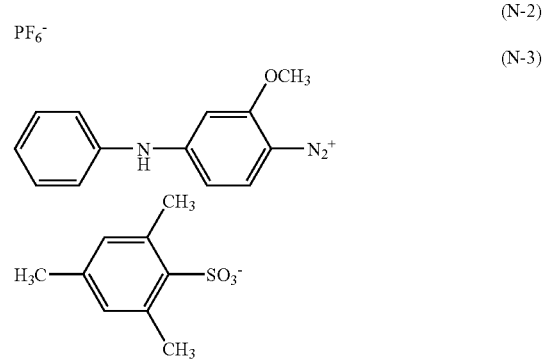
(N-2)
(N-3)

(N-4)

(N-5)

(N-6)

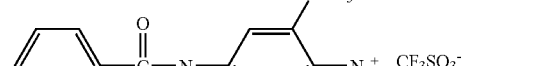

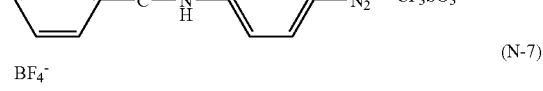
(N-7)

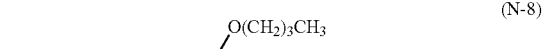
(N-8)

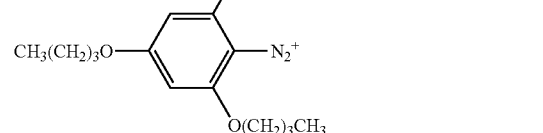

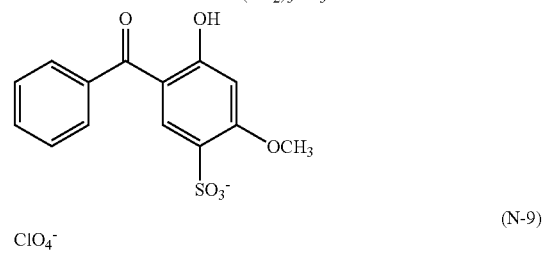
(N-9)

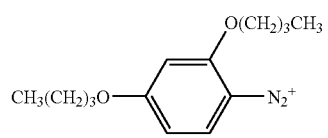 (N-10)
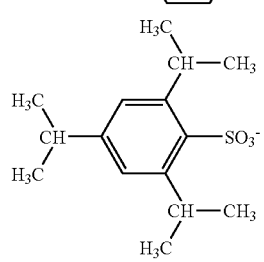 (N-11)
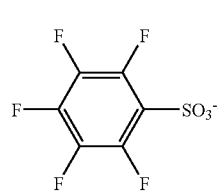 (N-12)
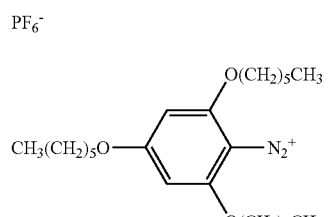 (N-13)
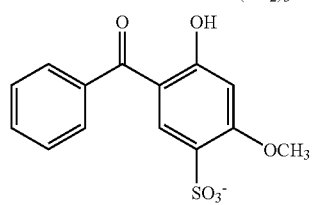 (N-14)
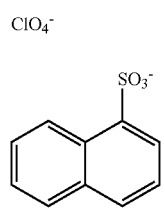 (N-15)
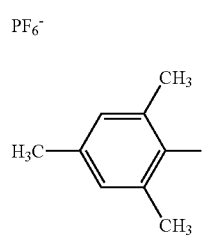 (N-16)
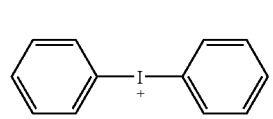 (N-17)
 (I-1)
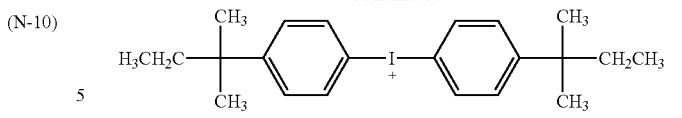 (I-3)
 (I-4)
 (I-5)
 (I-6)
 (I-7)
 (I-8)
 (I-9)
 (I-10)
 (I-11)
 (I-12)
 (I-13)
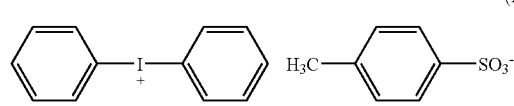 (I-2)

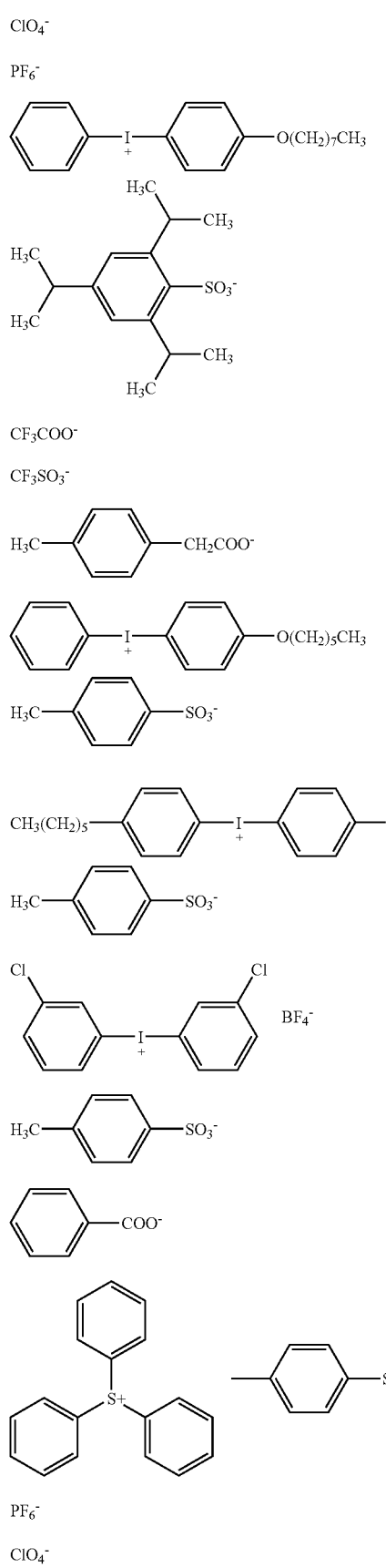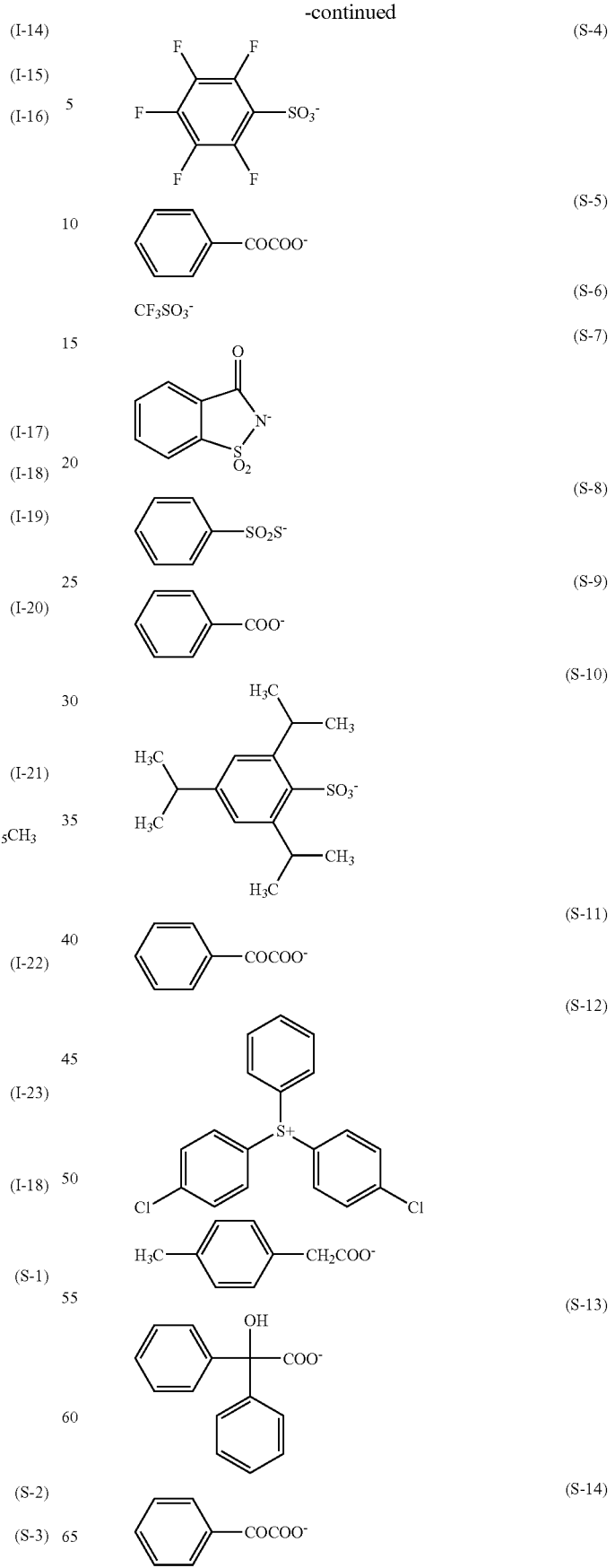

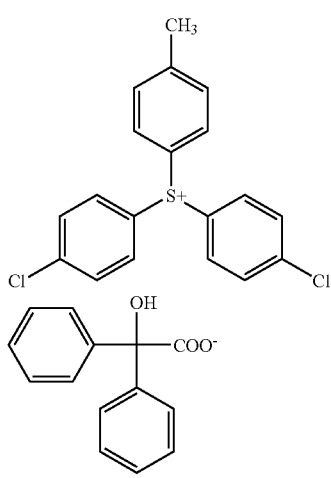
(S-15)

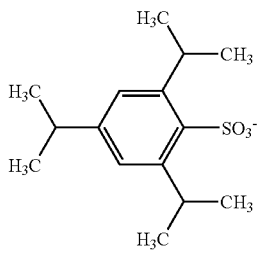
(S-16)

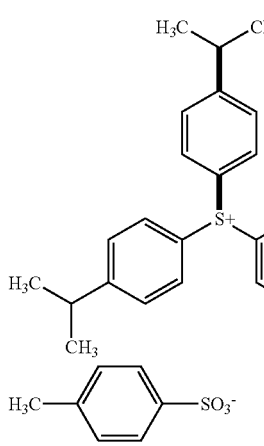
(S-17)

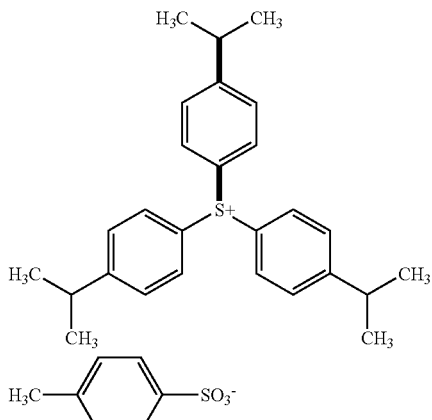
(S-18)

The radical polymerization initiator is not limited to those described above. In particular, from the standpoint of reactivity and stability, the triazine type initiators, organic halogen compounds, metallocene compounds, hexaarylbiimidazole compounds, organic boron compounds, oxime ester compounds and onium salt compounds are preferable and the triazine type initiators, organic halogen compounds, metallocene compounds, hexaarylbiimidazole compounds and onium salt compounds are more preferable.

The polymerization initiator can be added preferably in an amount from 0.1 to 50% by weight, more preferably from 0.5 to 30% by weight, particularly preferably from 0.8 to 20% by weight, based on the total solid content of the photosensitive layer.

<(D) Compound Containing an Ethylenically Unsaturated Bond>

The polymerizable compound for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 (the term "JP-B" as used herein means an "examined Japanese patent publication") and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \quad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth)acrylic acid, described in JP-A48-64183, JP-B49-43191 and JP-B-52-30490. Specific unsaturated compounds described in JP-B46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range of 5 to 80% by weight, more preferably in a range of 25 to 75% by weight, based on the total solid content of the photosensitive layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

(Chain Transfer Agent)

The photosensitive layer according to the invention may contain a chain transfer agent. The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the photosensitive layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Among them, a thiol compound represented by formula (II) shown below is particularly preferably used. By using the thiol compound represented by formula (II) as the chain transfer agent, a problem of the odor and decrease in sensitivity due to evaporation of the compound from the photosensitive layer or diffusion thereof into other layers are avoided and a lithographic printing plate precursor which is excellent in preservation stability and exhibits high sensitivity and good printing durability is obtained.

Formula (II):

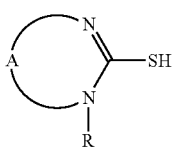

In formula (II), R represents an alkyl group which may have a substituent or an aryl group which may have a substituent; and A represents an atomic group necessary for forming a 5-membered or 6-membered hetero ring containing a carbon atom together with the N=C—N linkage, and A may have a substituent.

Compounds represented by formulae (IIA) and (IIB) shown below are more preferably used.

Formula (IIA):

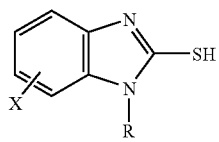

Formula (IIB):

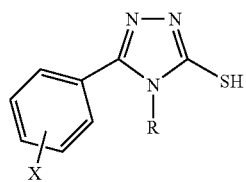

In formulae (IIA) and (IIB), R represents an alkyl group which may have a substituent or an aryl group which may have a substituent; and X represents a hydrogen atom, a halogen atom, an alkoxy group which may have a substituent, an alkyl group which may have a substituent or an aryl group which may have a substituent.

Specific examples of the compound represented by formula (II) are set forth below, but the invention should not be construed as being limited thereto.

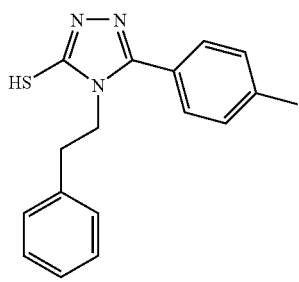

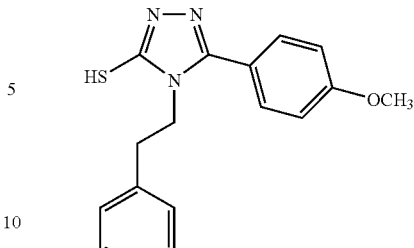

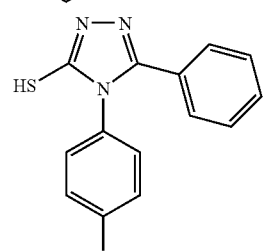

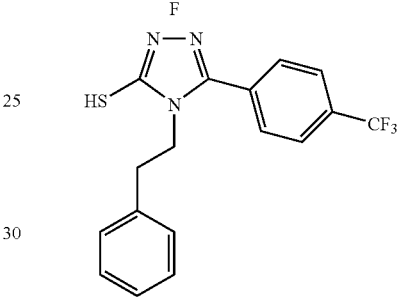

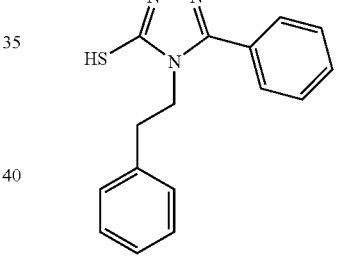

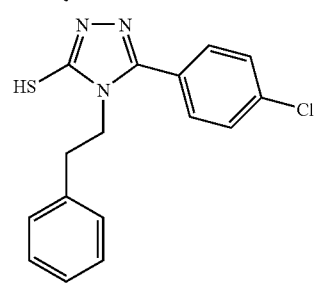

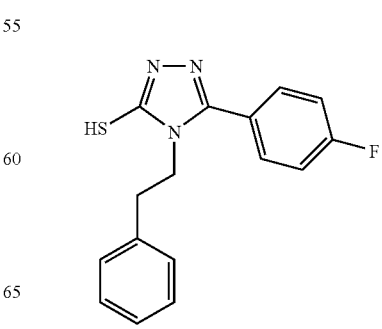

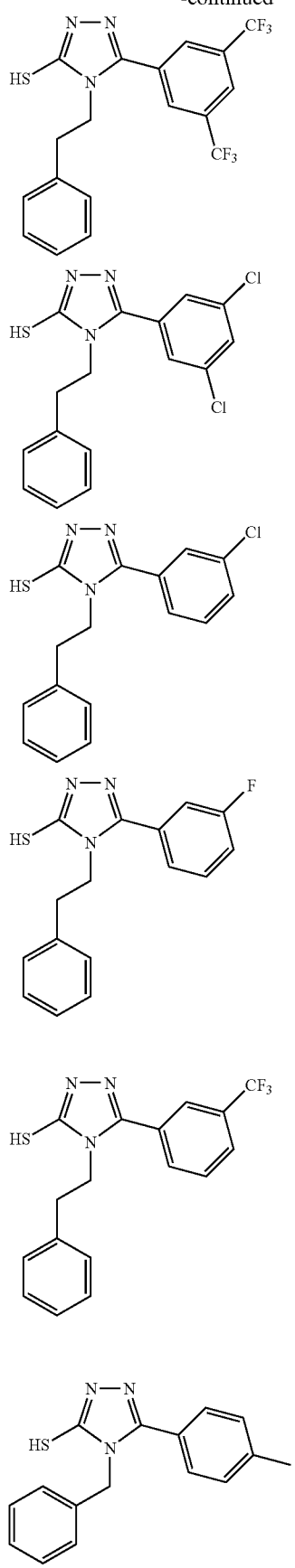
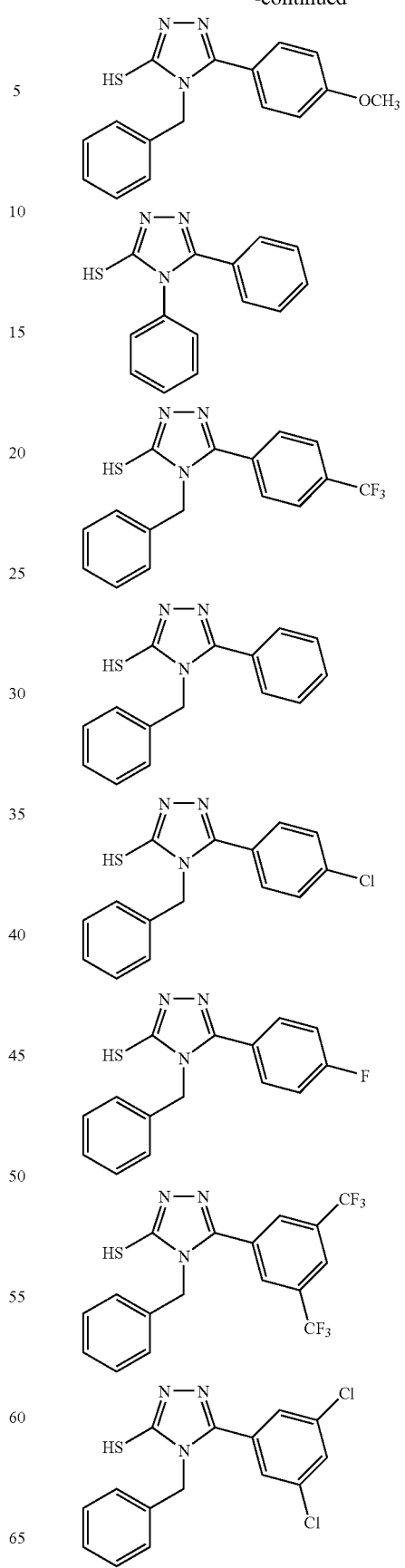

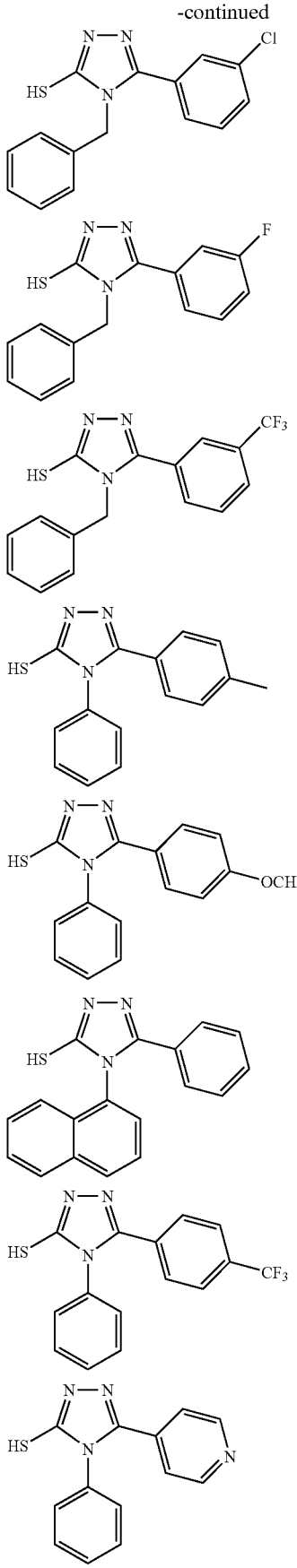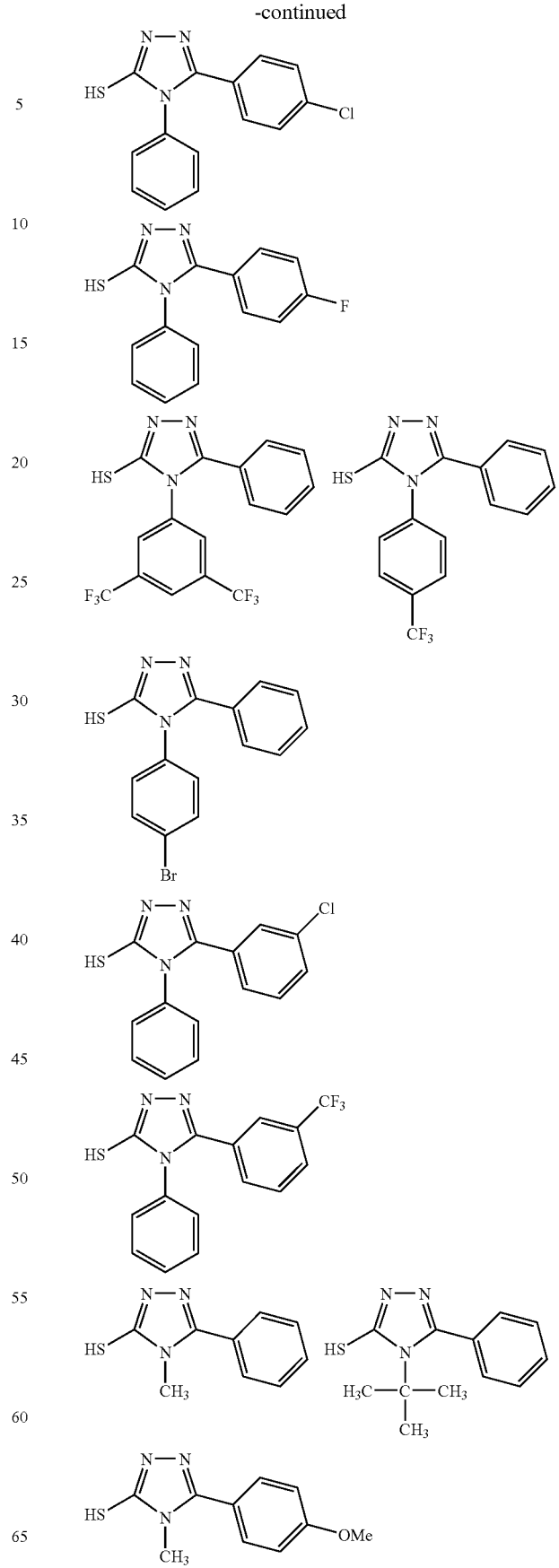

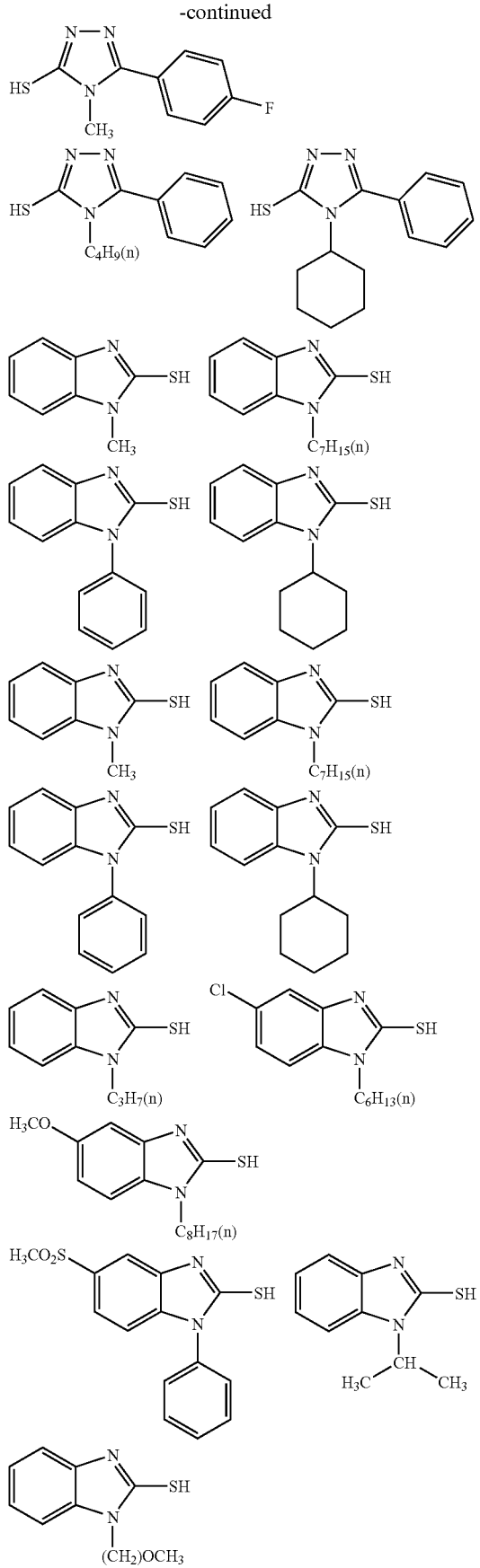
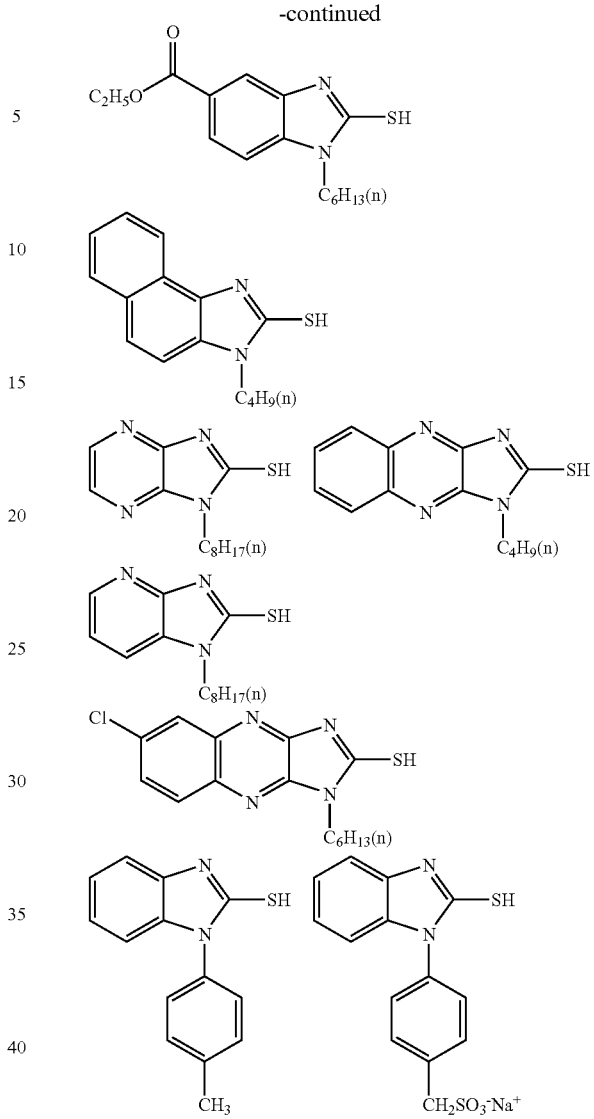

The amount of the chain transfer agent (for example, the thiol compound) used is preferably from 0.01 to 20% by weight, more preferably from 0.1 to 15% by weight, still more preferably from 1.0 to 10% by weight, based on the total solid content of the photosensitive layer.

(Microcapsule)

In the invention, in order to incorporate the above-described constituting components of the photosensitive layer and other constituting components described hereinafter into the photosensitive layer, a part or whole of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 μm, more preferably from 0.05 to 2.0 μm, particularly preferably from 0.10 to 1.0 μm. In the range described above, preferable resolution and good preservation stability can be achieved.

(Surfactant)

In the invention, it is preferred to use a surfactant in the photosensitive layer in order to progress the developing property and to improve the state of surface coated. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols and copolymers of polyethylene glycol and polypropylene glycol.

The anionic surfactant used in the invention is not particularly restricted and anionic surfactants hitherto known can be used Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The content of the surfactant is preferably from 0.001 to 10% by weight, more preferably from 0.01 to 7% by weight, based on the total solid content of the photosensitive layer.

(Hydrophilic Polymer)

In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone; a homopolymer or polymer of acrylamide, a homopolymer or copolymer of methacrylamide, a homopolymer or copolymer of N-methylolacrylamide, polyvinyl pyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

(Coloring Agent)

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

(Print-Out Agent)

In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p''-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye capable of undergoing discoloration by the effect of an acid or a radical is preferably added in an amount of 0.01 to 15% by weight based on the total solid content of the photosensitive layer.

(Polymerization Inhibitor)

It is preferred that a small amount of a thermal polymerization inhibitor is added to the photosensitive layer according to the invention in order to inhibit undesirable thermal polymerization of the radical polymerizable compound during the production or preservation of the photosensitive layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

(Higher Fatty Acid Derivative)

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

(Plasticizer)

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

(Fine Inorganic Particle)

The photosensitive layer according to the invention may contain fine inorganic particle in order to increase strength of the cured layer in the image area. The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm, more preferably from 0.5 to 3 μm. In the range described above, it is stably dispersed in the photosensitive layer, sufficiently maintains the film strength of the photosensitive layer and can form the non-image area excellent in hydrophilicity and preventing from the occurrence of stain at the printing.

The fine inorganic particle described above is easily available as a commercial product, for example, colloidal silica dispersion.

The content of the fine inorganic particle is preferably 20% by weight or less, more preferably 10% by weight or less, based on the total solid content of the photosensitive layer.

(Hydrophilic Low Molecular Weight Compound)

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

Next, a method for preparation of the lithographic printing plate precursor of the invention is described in more detail below. The lithographic printing plate precursor of the invention comprises the photosensitive layer and a support and is prepared by appropriately providing a protective layer, an undercoat layer or a backcoat layer depending on the use.

(Formation of Photosensitive Layer)

The photosensitive layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 g/m². In the range described above, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

(Support)

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$, more preferably from 1.5 to 4.0 g/m$^2$. In the range described above, good printing durability and favorable scratch resistance in the non-image area of lithographic printing plate can be achieved.

The aluminum plate subjected to the surface treatment and having the anodized film is used as it is as the support in the invention. However, in order to more improve an adhesion property to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and the sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion property to the photosensitive layer, good printing durability, and good resistance to stain can be achieved.

The color density of the support is preferably from 0.15 to 0.65 in terms of the reflection density value. In the range described above, good image-forming property by preventing halation at the image exposure and good aptitude for plate inspection after development can be achieved.

(Protective Layer)

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \leq (A) \leq 12$ (ml/m$^2$·day), still more preferably in a range of $2.0 \leq (A) \leq 10.0$ (ml/m$^2$·day). Besides the above described oxygen permeability, as for the characteristics required of the protective layer, it is desired that the protective layer does not substantially hinder the transmission of light for the exposure, is excellent in the adhesion property to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of the polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA405, PVA420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer, for example, polyvinyl alcohol (PVA) is ordinarily from 2,000 to 10,000,000, preferably from 20,000 to 3,000,000.

As other additive of the protective layer, glycerin, dipropylene glycol or the like can be added in an amount corresponding to several % by weight of the polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the polymer.

The adhesion property of the protective layer to the photosensitive layer and scratch resistance are also extremely important in view of handling of the printing plate precursor. Specifically, when a hydrophilic layer comprising a water-soluble polymer is laminated on the oleophilic photosensitive layer, layer peeling due to an insufficient adhesion property is liable to occur, and the peeled portion causes such a defect as failure in curing of the photosensitive layer due to polymerization inhibition by oxygen. Various proposals have been made for improving the adhesion property between the photosensitive layer and the protective layer. For example, it is described in U.S. patent application Ser. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a particle having a thin tabular shape and includes, for instance, mica, for example, natural mica represented by the following formula: A (B, C)$_{2-5}$D$_4$O$_{10}$(OH, F, O)$_2$, (wherein A represents any one of K, Na and Ca, B and C each represents any one of Fe (II), Fe(III), Mn, Al, Mg and V, and D represents Si or Al) or synthetic mica; talc represented by the following formula: 3MgO.4SiO.H$_2$O; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite KMg$_3$(AlSi$_3$O$_{10}$)F$_2$ or potassium tetrasilic mica KMg$_{2.5}$(Si$_4$O$_{10}$)F$_2$, and swellable mica, for example, Na tetrasilic mica NaMg$_{2.5}$(Si$_4$O$_{10}$)F$_2$, Na or Li teniolite (Na, Li)Mg$_2$Li(Si$_4$O$_{10}$)F$_2$, or montmorillonite based Na or Li hectolite (Na, Li)$_{1/8}$Mg$_{2/5}$Li$_{1/8}$(Si$_4$O$_{10}$)F$_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and in order to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, particularly preferably from 1 to 5 μm. An average thickness of the particle is ordinarily 0.1 μm or less, preferably 0.05 μm or less, particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion property to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range of 0.05 to 10 $g/m^2$ in terms of the coating amount after drying. When the protective layer contains the inorganic stratiform compound, it is more preferably in a range of 0.1 to 0.5 $g/m^2$, and when the protective layer does not contain the inorganic stratiform compound, it is more preferably in a range of 0.5 to 5 $g/m^2$.

(Undercoat Layer)

In the lithographic printing plate precursor according to the invention, an undercoat layer comprising a compound having a polymerizable group is preferably provided on the support. When the undercoat layer is used, the photosensitive layer is provided on the undercoat layer. The undercoat layer has the effects of strengthening the adhesion property between the support and the photosensitive layer in the exposed area and facilitating separation of the photosensitive layer from the support in the unexposed area, thereby improving the developing property.

As the compound for the undercoat layer, specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. A particularly preferable compound is a compound having both a polymerizable group, for example, a methacryl group or an allyl group and a support-adsorbing group, for example, a sulfonic acid group, a phosphoric acid group or a phosphoric acid ester group. Also, a compound having a hydrophilicity-imparting group, for example, an ethylene oxide group, in addition to the polymerizable group and the support-adsorbing group, can be preferably used.

The coating amount (solid content) of the undercoat layer is preferably from 0.1 to 100 mg/m$^2$, more preferably from 1 to 30 mg/m$^2$.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

(Image-Forming Method)

The lithographic printing plate precursor according to the invention is exposed imagewise by a light source of 360 to 450 nm, and then rubbed a surface of the exposed lithographic printing plate precursor with a rubbing member in the presence of the above-described developer of the invention in an automatic processor to remove the protective layer and the unexposed area of the photosensitive layer all at once, whereby an image can be formed on the surface of aluminum plate support. Specifically, after removing the protective layer and the unexposed area of the photosensitive layer all at once, the resulting printing plate is immediately mounted on a printing machine to conduct printing. The processing by the automatic processor in such a manner is advantageous in view of being free from the measures against development scum resulting from the protective layer and photosensitive layer encountered in case of performing on-machine development.

As the automatic processor, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl(meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used. The outer diameter of the rotating brush roller is preferably from 30 to 200 mm, and the peripheral velocity at the tip of the brush rubbing the plate surface is preferably from 0.1 to 5 m/sec. Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor of the invention, but when two or more rotating brush rollers are used in an automatic processor as shown in the Drawing, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate after the rubbing treatment may be subsequently subjected to water washing, a drying treatment and an oil-desensitization treatment, if desired. In the oil-desensitization treatment, a known oil-desensitizing solution can be used.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

The plate-making process is described in more detail below.

In the invention, although the development processing can be carried out just after the exposure step, the heat treatment step may intervene between the exposure step and the development step as described above. The heat treatment is effective for increasing the printing durability and improving uniformity of the image curing degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., still more preferably from 40 to 120° C.

In advance of the above-described development processing, the lithographic printing plate precursor is imagewise exposed through a transparent original having a line image, a halftone dot image or the like, or imagewise exposed, for example, by scanning of laser beam based on digital data.

The desirable wavelength of the light source is from 360 to 450 nm, and specifically, an InGaN semiconductor laser is preferably used. The exposure mechanism may be any of an internal drum system, an external drum system and a flat bed system.

Other examples of the exposure light source which can be used in the invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight.

As for the available laser light source of 360 to 450 nm, the followings can be used.

A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG (YVO$_4$) with SHG crystals×twice (355 nm, 5 mW to 1 W) and a combination of Cr:LiSAF with SHG crystal (430 nm, 10 mW); a semiconductor laser system, for example, a KNbO$_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (360 nm to 450 nm, 5 mW to 30 mW); a pulse laser, for example, N$_2$ laser (337 nm, pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

The laser used in the invention also includes an infrared laser. The infrared laser for use in the invention is not particularly restricted and, for example, a solid laser or semiconductor laser emitting an infrared ray having a wavelength of 760 to 1,200 nm is preferably exemplified. The output of the infrared laser is preferably 100 mW or more. Further, in order to shorten the exposure time, it is preferred to use a multibeam laser device.

The exposure time per pixel is preferably within 20 microseconds, and the irradiation energy is preferably from 10 to 300 mJ/cm$^2$.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of photosensitive material and the time for plate-making.

A single beam to triple beam exposure apparatus of internal drum system, using one or more gas or solid laser light sources so as to provide a semiconductor laser having a total output of 20 mW or more A multi-beam (from 1 to 10 beams) exposure apparatus of flat bed system, using one or more semiconductor, gas or solid lasers so as to provide a total output of 20 mW or more A multi-beam (from 1 to 9 beams) exposure apparatus of external drum system, using one or more semiconductor, gas or solid lasers so as to provide a total output of 20 mW or more A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X (J/cm$^2$) of photosensitive material, the exposure area S (cm$^2$) of photosensitive material, the power q (W) of one laser light source, the number n of lasers and the total exposure time t (s):

$$X \cdot S = n \cdot q \cdot t \qquad \text{(eq 1)}$$

i) In the Case of the Internal Drum (Single Beam) System

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \qquad \text{(eq 2)}$$

ii) In the Case of the External Drum (Multi-Beam) System

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad \text{(eq 3)}$$

iii) In the Case of the Flat Bed (Multi-Beam) System

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad \text{(eq 4)}$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 mJ/cm$^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, it is most preferably combined with an external drum system semiconductor laser multi-beam (10 or more beams) exposure apparatus.

EXAMPLES

The present invention will be described in more detail with reference to the following Examples and Comparative Examples, but the invention should not be construed as being limited thereto.

Examples 1 to 17 and Comparative Examples 1 to 4

Preparation of Series of Lithographic Printing Plate Precursors of Type I

An aluminum plate (material: JIS A1050) having a thickness of 0.3 mm was dipped in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm$^2$. Subsequently, the aluminum plate was dipped in an aqueous 1% by weight sodium hydroxide solution at 40° C. for 5 seconds, dipped in an aqueous 30% by weight sulfuric acid solution at 60° C. for 40 seconds to effect a desmut treatment, and then subjected to an anodizing treatment in an aqueous 20% by weight sulfuric acid solution for 2 minutes at a current density of 2 A/dm$^2$ to form an anodic oxide film having a thickness of 2.7 g/m$^2$. Thereafter, the aluminum plate was treated with an aqueous 1% by weight sodium silicate solution at 20° C. for 10 seconds.

The center line average roughness (Ra) of the thus-treated aluminum plate was measured using a stylus having a diameter of 2 μm and found to be 0.25 μm (Ra indication according to JIS B0601).

Further, Undercoat Solution (1) shown below was coated using a bar to have a dry coating amount of 10 mg/m$^2$ and dried in an oven at 80° C. for 10 seconds to prepare a support having an undercoat layer to be used in the experiments described below.

<Undercoat Solution (1)>

| | |
|---|---|
| Polymer Compound (1) | 0.017 g |
| (molecular weight: 100,000) shown below | |
| Methanol | 9.00 g |
| Water | 1.00 g |

Polymer Compound (1):

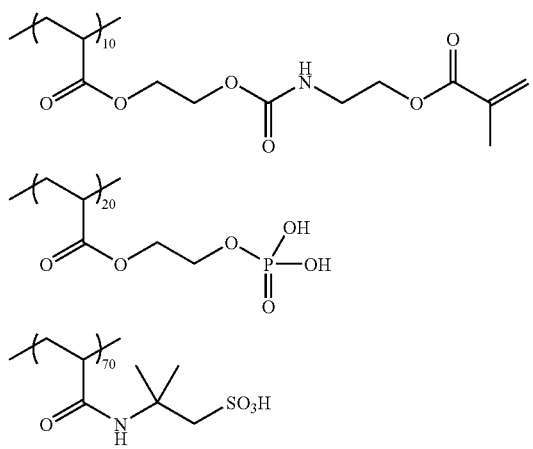

On the aluminum support having the undercoat layer prepared above, Coating Solution 1 for Photosensitive Layer having the composition shown below was coated using a bar and dried in an oven at 70° C. for 60 seconds to form a photosensitive layer having a dry coating amount of 1.1 g/m$^2$. On the photosensitive layer, Coating Solution 1 for Protective Layer having the composition shown below was coated using a bar to have a dry coating amount of 0.75 g/m$^2$ and dried at 125° C. for 70 seconds to form a protective layer, thereby preparing a series of Lithographic Printing Plate Precursors of Type I.

<Coating Solution 1 for Photosensitive Layer>

| | |
|---|---|
| Specific binder polymer according to the invention (as shown in Table 1 below) | 0.40 g |
| Compound containing ethylenically unsaturated bond Dipentaerythritol pentaacrylate (SR39, produced by Nippon Kayaku Co., Ltd.) | 0.58 g |
| Radical Polymerization Initiator (I-1) shown below | 0.08 g |
| Sensitizing Dye (D-1) shown below | 0.06 g |
| Chain Transfer Agent (S-1) shown below | 0.07 g |
| Dispersion of ε-phthalocyanine pigment [pigment: 15 parts by weight; dispersing agent (allyl methacrylate/methacrylic acid (80/20) copolymer (molecular weight: 70,000)): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (F-1) (molecular weight: 11,000) shown below | 0.001 g |
| Polyoxyethylene-polyoxypropylene condensate (Pluronic L44, produced by ADEKA Corp.) | 0.04 g |

| | |
|---|---|
| Tetraethylammonium chloride | 0.01 g |
| 1-Methoxy-2-propanol | 3.5 g |
| Methyl ethyl ketone | 8.0 g |

D-1

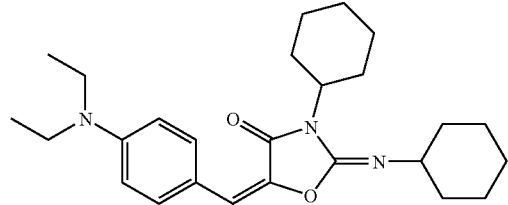

I-1

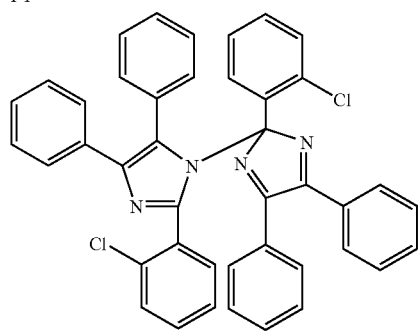

S-1

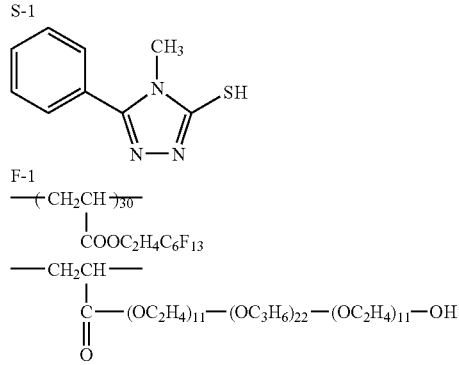

F-1

—(CH$_2$CH)$_{30}$—
        |
        COOC$_2$H$_4$C$_6$F$_{13}$

—CH$_2$CH—
        |
        C—(OC$_2$H$_4$)$_{11}$—(OC$_3$H$_6$)$_{22}$—(OC$_2$H$_4$)$_{11}$—OH
        ||
        O

<Coating Solution 1 for Protective Layer>

| | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

[Exposure, Development and Printing]

Each of the series of Lithographic Printing Plate Precursors of Type I was subjected to imagewise exposure using a semiconductor laser of 405 nm having an output of 100 mW while changing energy density. Within 30 seconds after the image exposure, the exposed lithographic printing plate precursor was put in an oven and heated the whole surface of the lithographic printing plate precursor by blowing hot air to maintain at 110° C. for 15 seconds.

Then, development processing was performed in an automatic development processor having a structure shown in the Drawing using Developer 1 having the composition shown below to prepare a lithographic printing plate (without heating). The pH of the developer was 4.6. The automatic development processor was an automatic processor having two rotating brush rollers. As for the rotating brush rollers used, the first brush roller was a brush roller having an outer diameter of 90 mm and being implanted with fiber of polybutylene terephthalate (bristle diameter: 200 μm, bristle length: 17 mm), and the brush roller was rotated at 200 rpm in the same direction as the transporting direction (peripheral velocity at the tip of brush: 0.94 m/sec). The second brush roller was a brush roller having an outer diameter of 60 mm and being implanted with fiber of polybutylene terephthalate (bristle diameter: 200 μm, bristle length: 17 mm), and the brush roller was rotated at 200 rpm in the opposite direction to the transporting direction (peripheral velocity at the tip of brush: 0.63 m/sec). The transportation of the lithographic printing plate precursor was performed while changing variously the transporting speed.

The developer was supplied on the surface of the lithographic printing plate precursor by showering from a spray pipe using a circulation pump. The tank volume for the developer was 10 liters.

| | |
|---|---|
| Developer 1 (pH is 4.5) | |
| Water | 100.00 g |
| Sodium sulfite | 5.00 g |
| Sodium hydrogen sulfite | 5.00 g |
| Benzyl alcohol | 1.00 g |
| Polyoxyethylene naphthyl ether (average number of oxyethylene: n = 13) | 5.00 g |
| Sodium salt of dioctylsulfosuccinic acid ester | 0.50 g |
| Gum Arabic (molecular weight: 200,000) | 1.00 g |
| Ethylene glycol | 0.50 g |
| Ammonium primary phosphate | 0.05 g |
| Citric acid | 0.05 g |
| Tetrasodium ethylenediaminetetraacetate | 0.05 g |
| Comparative Developer 1 (pH is 4.5) | |
| Water | 100.00 g |
| Benzyl alcohol | 1.00 g |
| Polyoxyethylene naphthyl ether (average number of oxyethylene: n = 13) | 5.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium ethylenediaminetetraacetate | 0.05 g |

The lithographic printing plate was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G (N) black ink (produced by Dai-Nippon Ink & Chemicals, Inc.).

[Evaluation]

With respect to the lithographic printing plate precursor described above, the developing property, sensitivity, printing durability and satin resistance were evaluated in the following manner. The results obtained are shown in Table 1.

<Developing Property>

With the lithographic printing plate obtained by performing the development while varying the transporting speed described above, cyan density of the non-image area was measured by a Macbeth densitometer. The transporting speed at which the cyan density of the non-image area became equivalent to cyan density of the aluminum support was determined and regarded as the developing property. The evaluation of developing property was indicated as a relative developing property defined as below using Comparative Example 1 as a criterion (1.0). The larger the value of relative developing property, the better the developing property and the more preferable the performance.

Relative developing property=(Transporting speed of subject lithographic printing plate precursor)/ (Transporting speed of criterion lithographic printing plate precursor)

<Sensitivity>

After performing printing of 100 sheets as described above and confirming that a printed material free from ink stain in the non-image area was obtained, 500 sheets were continuously printed. The exposure amount for causing no unevenness in the ink density of the image area on the 600th printed material was determined as the sensitivity. The evaluation of sensitivity was indicated as a relative sensitivity defined as below using Comparative Example 1 as a criterion (1.0). The larger the value of relative sensitivity, the higher the sensitivity and the more preferable the performance.

Relative sensitivity=(Sensitivity of criterion lithographic printing plate precursor)/(Sensitivity of subject lithographic printing plate precursor)

<Printing Durability>

As increase in the number of printing sheets, the photosensitive layer was gradually abraded to cause decrease in the ink receptivity, resulting in decrease of ink density on printing paper. With respect to the lithographic printing plate obtained by the exposure in the same exposure amount, a number of printed materials obtained until the ink density (reflection density) decreased by 0.1 from that at the initiation of printing was determined to evaluate the printing durability. The evaluation of printing durability was indicated as a relative printing durability defined as below using Comparative Example 1 as a criterion (1.0). The larger the value of relative printing durability, the higher the printing durability.

Relative printing durability=(Printing durability of subject lithographic printing plate precursor)/ (Printing durability of criterion lithographic printing plate precursor)

<Stain Resistance>

After performing printing of 500 sheets as described above and the stain resistance was evaluated according to the following criteria:
◎: Ink satin was not observed at all in the non-image area
○: Although stain resistance was poor in comparison with ◎, there is no problem for practical use.
Δ: Ink stain was partially observed and there is a problem for practical use.
x: Ink stain occurred.

TABLE 1

| | Binder Polymer | Developer | Developing Property | Sensitivity | Printing Durability | Stain Resistance |
|---|---|---|---|---|---|---|
| Example 1 | PA-1 | Developer 1 | 1.7 | 1.0 | 2.0 | ◎ |
| Example 2 | PA-2 | Developer 1 | 1.7 | 1.0 | 1.8 | ◎ |
| Example 3 | PA-3 | Developer 1 | 1.8 | 1.0 | 2.1 | ◎ |
| Example 4 | PA-4 | Developer 1 | 1.8 | 1.1 | 2.1 | ◎ |
| Example 5 | PA-8 | Developer 1 | 1.5 | 1.0 | 1.8 | ◎ |
| Example 6 | PA-11 | Developer 1 | 1.7 | 1.0 | 1.8 | ◎ |
| Example 7 | PA-12 | Developer 1 | 1.6 | 1.0 | 1.8 | ◎ |
| Example 8 | PA-13 | Developer 1 | 1.5 | 1.1 | 1.8 | ◎ |
| Example 9 | PA-14 | Developer 1 | 1.2 | 1.0 | 1.8 | ◎ |
| Example 10 | PV-1 | Developer 1 | 1.7 | 1.0 | 1.9 | ◎ |
| Example 11 | PV-3 | Developer 1 | 1.7 | 1.1 | 1.7 | ◎ |
| Example 12 | PU-1 | Developer 1 | 1.7 | 1.0 | 2.6 | ◎ |
| Example 13 | PU-4 | Developer 1 | 1.8 | 1.0 | 2.8 | ◎ |
| Example 14 | PU-6 | Developer 1 | 1.8 | 1.1 | 2.4 | ◎ |
| Example 15 | PU-9 | Developer 1 | 1.7 | 1.0 | 2.4 | ◎ |
| Example 16 | PU-11 | Developer 1 | 1.7 | 1.1 | 2.3 | ◎ |
| Example 17 | PU-13 | Developer 1 | 1.7 | 1.0 | 2.4 | ◎ |
| Comparative Example 1 | PA-1 | Comparative Developer 1 | 1.0 | 1.0 | 1.0 | x |
| Comparative Example 2 | PU-4 | Comparative Developer 1 | 0.8 | 0.8 | 1.2 | x |
| Comparative Example 3 | P-4 | Developer 1 | 1.1 | 1.1 | 1.0 | Δ |
| Comparative Example 4 | P-8 | Developer 1 | 0.9 | 0.9 | 1.2 | Δ |

As shown in Table 1, it can be seen that by using the developer containing a sulfite and a bisulfite according to the invention, the developing property and printing durability can be respectively improved in comparison with Comparative Examples 1 and 2 outside the invention. Further, it is unexpected that the stain resistance of the lithographic printing plate obtained is improved by using the developer according to the invention in comparison with Comparative Examples 1 and 2, while it is considered that the developer contributes the adsorption property to the aluminum support. It is believed that this is achieved by the progress of polarity change reaction to form a sulfonate as expected to cause electrostatic repulsion between the sulfonate and the polymer in the undercoat layer.

It is also apparent that by using the binder polymer containing at least one group capable of being converted to a sulfonate upon a reaction with a sulfite and/or a bisulfite as the binder polymer, not only the developing property can be improved but also the printing durability can be improved. It is supposed that this is because the discrimination between the developer permeability and dampening water permeability can be improved as expected to achieve the good developing property and high printing durability. Further, it can be seen that the use of a tertiary amine or a salt thereof as the hydrophilic group in the binder polymer is preferable in view of the printing durability.

On the contrary, Comparison Examples 3 and 4 in which the binder polymer according to the invention is not used are inferior to the examples of the invention with respect to the developing property, printing durability and stain resistance. From these results, it is understood that the combination of the binder polymer and the developer containing a sulfite and/or a bisulfite according to the invention is optimal.

Examples 18 to 34 and Comparative Examples 5 to 8

[Preparation of Series of Lithographic Printing Plate Precursors of Type II]

Series of Lithographic Printing Plate Precursors of Type II were prepared using the same materials including the undercoat solution as those used in the preparation of Series of Lithographic Printing Plate Precursors of Type I except for changing Coating Solution 1 for Photosensitive Layer to Coating Solution 2 for Photosensitive Layer and changing Coating Solution 1 for Protective Layer to Coating Solution 2 for Protective Layer, respectively.

<Coating Solution 2 for Photosensitive Layer>

| | |
|---|---|
| Specific binder polymer according to the invention (as shown in Table 2 below) | 0.54 g |
| Compound containing ethylenically unsaturated bond (M-1) shown below | 0.48 g |
| Radical Polymerization Initiator (I-1) shown above | 0.08 g |
| Sensitizing Dye (D-1) shown above | 0.06 g |
| Chain Transfer Agent (S-2) shown below | 0.07 g |
| Dispersion of ε-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-Based Surfactant (F-1) shown above | 0.001 g |
| Polyoxyethylene-polyoxypropylene condensate (Pluronic L44, produced by ADEKA Corp.) | 0.04 g |
| Tetraethylammonium chloride | 0.01 g |
| 1-Methoxy-2-propanol | 3.5 g |
| Methyl ethyl ketone | 8.0 g |

M-1
A mixture of the following compounds:

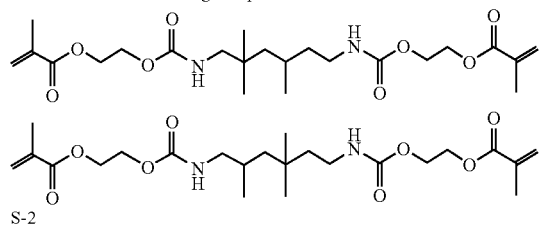

S-2

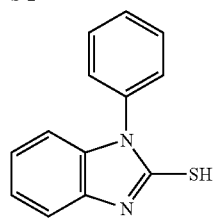

<Coating Solution 2 for Protective Layer>

| | |
|---|---|
| Dispersion of Mica (1) shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.050 g |
| Surfactant (Emalex 710, produced by Nihon-Emulsion Co., Ltd.) | 0.050 g |
| Water | 133.00 g |

(Preparation of Dispersion of Mica (1))

In 368 g of water was added 32 g of synthetic mica (Somasif ME-100, produced by CO-OP Chemical Co., Ltd.; aspect ratio: 1,000 or more) and the mixture was dispersed using a homogenizer until the average particle diameter (measured by a laser scattering method) became 0.5 μm to obtain Dispersion of Mica (1).

[Exposure, Development and Printing]

Each of the series of Lithographic Printing Plate Precursors of Type II was subjected to the exposure, development and printing in the same manner as in Example 1 except for changing Developer 1 to Developer 2 having the composition shown below.

| Developer 2 | |
|---|---|
| Water | 100.00 g |
| Sodium sulfite | 5.00 g |
| Sodium hydrogen sulfite | 5.00 g |
| N-lauryl dimethyl betaine (Pionin C157K, produced by Takemoto Oil & Fat Co., Ltd.) | 10.00 g |
| Polystyrenesulfonic acid | 1.00 g |
| Ammonium primary phosphate | 0.05 g |
| Citric acid | 0.05 g |
| Tetrasodium ethylenediaminetetraacetate | 0.05 g |

The pH was adjusted to 5.0 with phosphoric acid to use as Developer 2.

| Comparative Developer 2 | |
|---|---|
| Water | 100.00 g |
| N-lauryl dimethyl betaine (Pionin C157K, produced by Takemoto Oil & Fat Co., Ltd.) | 10.00 g |
| Polystyrenesulfonic acid | 1.00 g |
| Ammonium primary phosphate | 0.05 g |
| Citric acid | 0.05 g |
| Tetrasodium ethylenediaminetetraacetate | 0.05 g |

The pH was adjusted to 5.0 with phosphoric acid to use as Comparative Developer 2.

[Evaluation]

With respect to the lithographic printing plate precursor described above, the evaluation was conducted in the same manner as in Example 1. As the criterion (1.0) of the evaluation of developing property, sensitivity or printing durability, Comparative Example 5 was used. The results obtained are shown in Table 2.

TABLE 2

| | Binder Polymer | Developer | Developing Property | Sensitivity | Printing Durability | Stain Resistance |
|---|---|---|---|---|---|---|
| Example 18 | PA-2 | Developer 2 | 1.8 | 1.0 | 1.9 | ◎ |
| Example 19 | PA-3 | Developer 2 | 1.7 | 1.1 | 2.0 | ◎ |
| Example 20 | PA-4 | Developer 2 | 1.7 | 1.1 | 2.0 | ◎ |
| Example 21 | PA-5 | Developer 2 | 1.8 | 1.0 | 1.8 | ◎ |
| Example 22 | PA-6 | Developer 2 | 1.6 | 1.1 | 1.8 | ◎ |
| Example 23 | PA-8 | Developer 2 | 1.7 | 1.1 | 1.8 | ◎ |
| Example 24 | PA-11 | Developer 2 | 1.7 | 1.0 | 2.0 | ◎ |
| Example 25 | PA-13 | Developer 2 | 1.8 | 1.0 | 2.0 | ◎ |
| Example 26 | PA-14 | Developer 2 | 1.6 | 1.0 | 2.0 | ◎ |
| Example 27 | PV-1 | Developer 2 | 1.7 | 1.0 | 1.8 | ◎ |
| Example 28 | PV-3 | Developer 2 | 1.7 | 1.0 | 1.7 | ◎ |
| Example 29 | PU-3 | Developer 2 | 1.7 | 1.0 | 2.6 | ◎ |
| Example 30 | PU-5 | Developer 2 | 1.7 | 1.0 | 2.6 | ◎ |
| Example 31 | PU-7 | Developer 2 | 1.7 | 1.1 | 2.7 | ◎ |
| Example 32 | PU-10 | Developer 2 | 1.8 | 1.1 | 2.6 | ◎ |
| Example 33 | PU-11 | Developer 2 | 1.8 | 1.1 | 2.3 | ◎ |
| Example 34 | PU-14 | Developer 2 | 1.8 | 1.0 | 2.6 | ◎ |
| Comparative Example 5 | PA-1 | Comparative Developer 2 | 1.0 | 1.0 | 1.0 | x |
| Comparative Example 6 | PU-4 | Comparative Developer 2 | 0.8 | 0.8 | 1.2 | x |
| Comparative Example 7 | P-4 | Developer 2 | 1.1 | 1.1 | 1.0 | Δ |
| Comparative Example 8 | P-8 | Developer 2 | 0.9 | 0.8 | 1.1 | Δ |

As shown in Table 2, it can be seen that by using the binder polymer containing at least one group capable of being converted to a sulfonate upon a reaction with a sulfite and/or a bisulfite and the developer containing a sulfite and a bisulfite according to the invention, the developing property, printing durability and stain resistance can be respectively improved in comparison with Comparative Examples 5 and 6 outside the invention.

It is also apparent that when the binder polymer containing at least one group capable of being converted to a sulfonate upon a reaction with a sulfite and/or a bisulfite is not used as the binder polymer (Comparative Examples 7 and 8), the developing property, printing durability and stain resistance are decreased similar to the results shown in Table 1.

Further, it can be seen from the results shown in Table 2 also that the use of a tertiary amine or a salt thereof as the hydrophilic group in the binder polymer is preferable in view of the printing durability.

Examples 35 to 37 and Comparative Examples 9 to 13

[Preparation of Series of Lithographic Printing Plate Precursors of Type III]
[Preparation of Support]

An aluminum web (material: JIS A1050) having a thickness of 0.30 mm was subjected to a degrease treatment by washing with trichloroethylene. Then, the aluminum web surface was grained using a nylon brush and an aqueous suspension of 400 mesh pumice stone and thoroughly washed with water. The aluminum web was subjected to etching by immersing it in an aqueous 25% by weight sodium hydroxide solution at 45° C. for 9 seconds and after washing with water, immersed in an aqueous 2% by weight nitric acid solution for 20 seconds, followed by washing with water. The etching amount of the grained surface was about 3 g/m². The aluminum web was then treated in an aqueous 7% by weight sulfuric acid solution as an electrolytic solution at a current density of 15 A/dm² to provide a direct current anodic oxide film of 3 g/m² on the surface of aluminum web. Thereafter, in order to ensure the hydrophilicity for the non-image area of a printing plate, the aluminum web was subjected to a silicate treatment. Specifically, the aluminum web was conveyed in an aqueous 1.5% by weight sodium silicate solution No. 3 maintained at 70° C. so as to have the aluminum web contact time of 18 seconds, followed by washing with water. The adhesion amount of Si was 12 mg/m².

[Undercoat]

The undercoat solution shown below was coated on the aluminum support by a wire bar and dried at 120° C. for 70 seconds using a warm air drying machine. The coating amount of the undercoat after drying was 80 mg/cm².

<Undercoat Solution>

| | |
|---|---|
| Aluminum alkylacetoacetate diisopropylate (Alumichelate M, produced by Kawaken Fine Chemicals. Co., Ltd.) | 1.0 g |
| Methanol | 100 g |
| Ion-exchanged water | 10 g |

[Formation of Image-Recording Layer]

The coating solution for image-recording layer shown below was coated on the support having the undercoat layer described above and dried at 95° C. for 45 seconds using a warm air drying machine to form an image-recording layer, thereby preparing a lithographic printing plate precursor. The coating amount of the image-recording layer after drying was 1.4 g/m².

<Coating Solution P-1 for Image-Recording Layer>

| | |
|---|---|
| Onium salt [OS-7] shown below | 0.25 g |
| Polymerizable compound [RM-1] shown below | 0.60 g |
| Infrared absorbing agent [IR-13] shown below | 0.06 g |
| Polymer shown in Table 3 | 1.40 g |
| Naphthalenesulfonate of Victoria Pure Blue | 0.04 g |
| 1-Docosanol | 0.01 g |

-continued

| | |
|---|---|
| Polymerizyation inhibitor (Irganox 1010, produced by Ciba Speciality Chemicals Inc.) | 0.005 g |
| Fluorine-Based Surfactant (Megafac KF309, produced by Dainippon Ink & Chemicals, Inc.) | 0.03 g |
| Methyl ethyl ketone | 10 g |
| γ-Butyrolactone | 5 g |
| Methanol | 7 g |
| 1-Methoxy-3-propanol | 5 g |

The structural formulae of the compounds used in the coating solution for image-recording layer are shown below.

PI-1

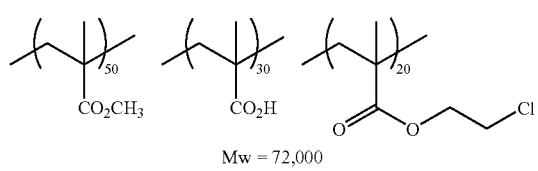

Mw = 72,000

PI-2

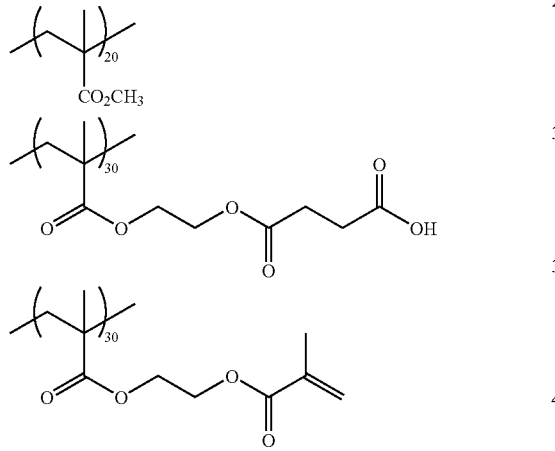

Mw = 85,000

PI-3

Polyadduct of (a) to (e):

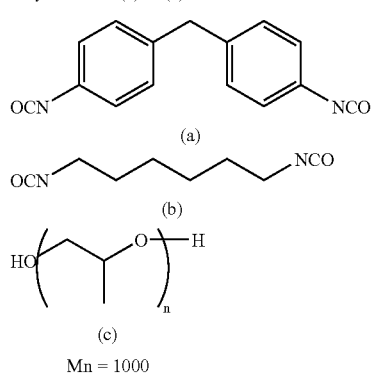

Mn = 1000

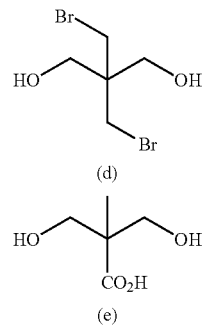

(d)

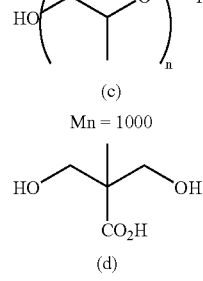

(e)

Mw = 60,000

(a)/(b)/(c)/(d)/(e) = 40/10/10/20/20

PR-1

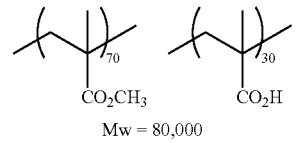

Mw = 80,000

PR-2

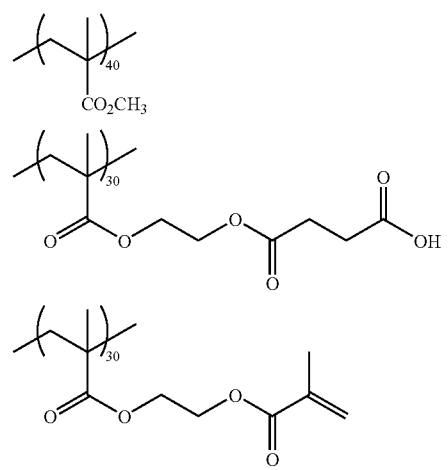

PR-3

Polyadduct of (a) to (d):

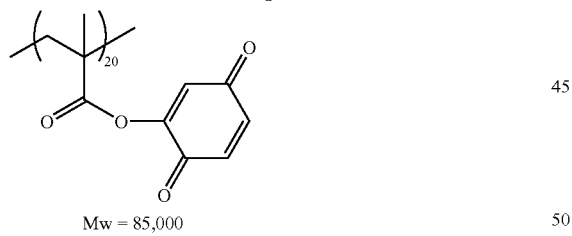

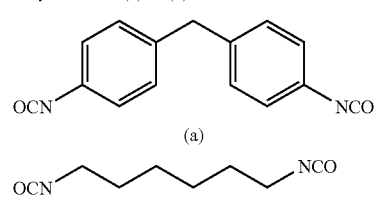

Mn = 1000

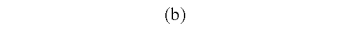

(d)

Mw = 100,000

(a)/(b)/(c)/(d) = 40/10/10/40

-continued

[OS-7]

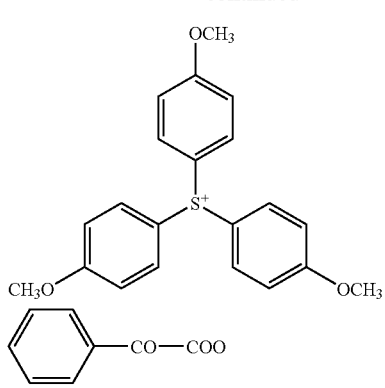

[RM-1]

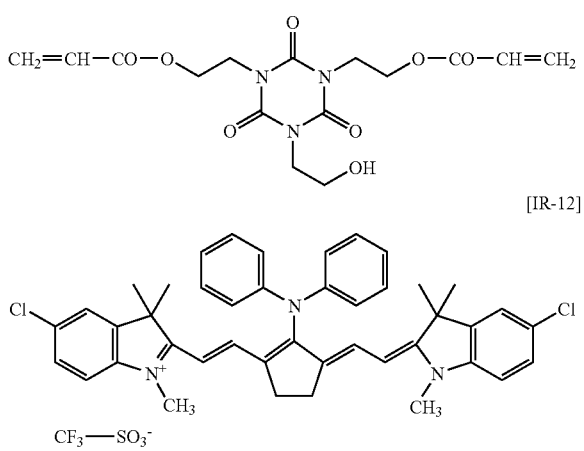

[IR-12]

A CTP output system comprising a plate material supplying device (SA-L8000), an exposure device (Luxel T-9000CTP), a conveyer (T-9000 Conveyor), an automatic developing machine (LP-1310H) and a stocker (ST-1160), produced by Fuji Film Co., Ltd. was used. Each of the developers having the composition shown below was charged in a developing processing bath of the automatic developing machine and maintained at 30° C. In the second bath of the automatic developing machine was charged tap water and in the third bath of the automatic developing machine was charged a finishing gum solution prepared by diluting FN-6 (produced by Fuji Film Co., Ltd.) with water (1:1).
Preparation of Developer Each developer was prepared by dissolving the compounds shown below in water.
[Developer 3 (pH: 11.0)]
Developer prepared by adding potassium hydroxide to a solution containing 3% by weight of sodium sulfite, 5% by weight of a surfactant of formula Y-1 shown below and 0.2% by weight of 4 Na salt of ethylenediaminetetraacetic acid (chelating agent) to adjust the pH to 11.0.

Y-1

[Comparative Developer 3 (pH: 11.0)]
Developer having the same composition as Developer 3 except for eliminating the sodium sulfite.

The lithographic printing plate precursor was loaded in the plate material supplying device, subjected continuously and automatically to exposure and development processing using Developer 3 or Comparative Developer 3 and discharged in the stocker. The exposure was conducted at resolution of 2,400 dpi while changing a halftone dot of 175 lines from 0.5 to 99.5%. The status of the halftone dot formed on the resulting printing plate was visually observed using a loupe. As a result, it was found that all halftone dots of 0.5 to 99.5% were formed.

[Evaluation]

With respect to the lithographic printing plate precursor described above, the evaluations of developing property, sensitivity, printing durability and stain resistance were conducted in the same manner as in Example 1. As the criterion (1.0) of the evaluation of developing property, sensitivity or printing durability, Comparative Example 9 was used. The results obtained are shown in Table 3.

TABLE 3

| | Binder Polymer | Developer | Developing Property | Sensitivity | Printing Durability | Stain Resistance |
|---|---|---|---|---|---|---|
| Example 35 | PI-1 | Developer 3 | 1.5 | 1.1 | 1.4 | ◉ |
| Example 36 | PI-2 | Developer 3 | 1.4 | 1.1 | 1.5 | ◉ |
| Example 37 | PI-3 | Developer 3 | 1.4 | 1.1 | 1.5 | ◉ |
| Comparative Example 9 | PI-1 | Comparative Developer 3 | 1.0 | 1.0 | 1.0 | Δ |
| Comparative Example 10 | PI-2 | Comparative Developer 3 | 0.9 | 0.8 | 1.2 | Δ |
| Comparative Example 11 | PR-1 | Developer 3 | 1.1 | 1.0 | 1.0 | Δ |
| Comparative Example 12 | PR-2 | Developer 3 | 0.9 | 0.8 | 1.1 | Δ |
| Comparative Example 13 | PR-3 | Developer 3 | 1.0 | 1.0 | 1.1 | Δ |

As shown in Table 3, it can be seen that by using the binder polymer containing at least one group capable of being converted to a sulfonate upon a reaction with a sulfite and/or a bisulfite and the developer containing a sulfite according to the invention, the developing property, printing durability and stain resistance can be respectively improved in comparison with Comparative Examples 9 and 10 outside the invention.

It is also apparent that when the binder polymer containing at least one group capable of being converted to a sulfonate upon a reaction with a sulfite and/or a bisulfite is not used as the binder polymer (Comparative Examples 11 to 13), the developing property, printing durability and stain resistance are decreased similar to the results shown in Table 1.

This application is based on Japanese Patent application JP 2007-256781, filed Sep. 28, 2007, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. An image-forming method comprising:
exposing a negative type image-forming material to light, the negative type image-forming material comprising a support and an image-recording layer comprising (A) a binder polymer comprising at least one group capable of being converted to a sulfonate upon a reaction with an aqueous solution comprising at least one of a sulfite and a bisulfite, (B) a sensitizing dye, (C) a polymerization initiator, and (D) a compound having an ethylenically unsubstituted bond; and
removing an unexposed area of the image-recording layer with an aqueous solution comprising at least one of a sulfite and a bisulfite,
wherein the group capable of being converted to a sulfonate upon a reaction with an aqueous solution comprising at least one of a sulfite and a bisulfite is a group selected from the group consisting of a bromine atom, an iodine atom, an unsaturated triple bond group, an aldehyde group, a ketone group and a combination thereof.

2. The image-forming method as claimed in claim 1, wherein the aqueous solution has pH of from 2 to 10.

3. The image-forming method as claimed in claim 1, wherein the binder polymer has a hydrophilic group.

4. The image-forming method as claimed in claim 1, wherein the binder polymer has a hydrophilic group selected from a carboxylic acid group, a salt formed by neutralization of a carboxylic acid group, an amino group, an ammonium group, an amido group, a hydroxy group, a —$CH_2CH_2O$— repeating unit and a —$CH_2CH_2NH$— repeating unit.

5. The image-forming method as claimed in claim 1, wherein the binder polymer has a hydrophilic group selected from an amino group, an ammonium group, an amido group, a hydroxy group, a —$CH_2CH_2O$— repeating unit and a —$CH_2CH_2NH$— repeating unit.

6. The image-forming method as claimed in claim 1, wherein the group capable of being converted to a sulfonate upon a reaction with an aqueous solution comprising at least one of a sulfite and a bisulfite is a group selected from the group consisting of an unsaturated triple bond group, an aldehyde group, a ketone group and a combination thereof.

* * * * *